(12) United States Patent
Fujii et al.

(10) Patent No.: US 8,981,333 B2
(45) Date of Patent: Mar. 17, 2015

(54) NONVOLATILE SEMICONDUCTOR MEMORY DEVICE AND METHOD OF MANUFACTURING THE SAME

(71) Applicant: Panasonic Corporation, Osaka (JP)

(72) Inventors: Satoru Fujii, Osaka (JP); Satoru Ito, Hyogo (JP); Takumi Mikawa, Shiga (JP)

(73) Assignee: Panasonic Intellectual Property Management, Co., Ltd., Osaka (JP)

( * ) Notice: Subject to any disclaimer, the term of this patent is extended or adjusted under 35 U.S.C. 154(b) by 85 days.

(21) Appl. No.: 13/991,964

(22) PCT Filed: Oct. 10, 2012

(86) PCT No.: PCT/JP2012/006498
§ 371 (c)(1),
(2) Date: Jun. 6, 2013

(87) PCT Pub. No.: WO2013/054515
PCT Pub. Date: Apr. 18, 2013

(65) Prior Publication Data
US 2013/0248813 A1    Sep. 26, 2013

(30) Foreign Application Priority Data

Oct. 12, 2011   (JP) ................................. 2011-225309

(51) Int. Cl.
*H01L 45/00* (2006.01)
*H01L 27/10* (2006.01)
*H01L 27/24* (2006.01)

(52) U.S. Cl.
CPC .......... *H01L 45/1253* (2013.01); *H01L 27/101* (2013.01); *H01L 45/16* (2013.01);
(Continued)

(58) Field of Classification Search
CPC .. H01L 45/08; H01L 45/1253; H01L 45/1266
USPC ........................... 257/2–4, E45.002, E45.003
See application file for complete search history.

(56) References Cited

U.S. PATENT DOCUMENTS 7,029,924 B2 *   4/2006   Hsu et al. .......................... 438/3
7,696,502 B2     4/2010   Jin et al.
(Continued)

FOREIGN PATENT DOCUMENTS

JP          4167298       10/2008
JP        2008-294201     12/2008
(Continued)

OTHER PUBLICATIONS

International Search Report issued Jan. 8, 2013 in International (PCT) Application No. PCT/JP2012/006498.

*Primary Examiner* — Allison P Bernstein
(74) *Attorney, Agent, or Firm* — Wenderoth, Lind & Ponack, L.L.P.

(57) ABSTRACT

Provided is a nonvolatile semiconductor memory device including a variable resistance element in which a parasitic resistance between the lower electrode and the variable resistance layer included in the variable resistance element is reduced. The nonvolatile semiconductor memory device includes: a substrate; and a variable resistance element formed on the substrate, wherein the variable resistance element includes a lower electrode layer formed on the substrate, a variable resistance layer formed on the lower electrode layer, and an upper electrode layer formed on the variable resistance layer, the lower electrode layer includes at least a first conductive layer and a second conductive layer which is formed on the first conductive layer and is in contact with the variable resistance layer, and the first conductive layer includes an oxidatively degraded layer which is formed on an upper surface of the first conductive layer due to oxidization of the first conductive layer.

10 Claims, 18 Drawing Sheets

(52) U.S. Cl.
CPC ............. *H01L 45/08* (2013.01); *H01L 45/146* (2013.01); *H01L 45/1625* (2013.01); *H01L 27/2436* (2013.01); *H01L 27/2463* (2013.01)
USPC ........................... 257/4; 257/2; 257/E45.003

(56) References Cited

U.S. PATENT DOCUMENTS

| | | | |
|---|---|---|---|
| 7,875,872 | B2 | 1/2011 | Jin et al. |
| 8,022,502 | B2 | 9/2011 | Kanzawa et al. |
| 8,088,644 | B2 | 1/2012 | Jin et al. |
| 8,258,493 | B2 | 9/2012 | Mikawa et al. |
| 8,598,564 | B2 * | 12/2013 | Sakotsubo ................ 257/4 |
| 2007/0107774 | A1 | 5/2007 | Jin et al. |
| 2007/0210297 | A1 * | 9/2007 | Symanczyk ................ 257/2 |
| 2007/0285967 | A1 * | 12/2007 | Toda et al. ................ 365/148 |
| 2008/0211036 | A1 * | 9/2008 | Zhao et al. ................ 257/379 |
| 2009/0026434 | A1 * | 1/2009 | Malhotra et al. .............. 257/2 |
| 2009/0224224 | A1 | 9/2009 | Fujii et al. |
| 2009/0227067 | A1 * | 9/2009 | Kumar et al. ............... 438/104 |
| 2009/0283736 | A1 | 11/2009 | Kanzawa et al. |
| 2010/0021626 | A1 * | 1/2010 | Hsieh et al. ................ 427/77 |
| 2010/0032641 | A1 | 2/2010 | Mikawa et al. |
| 2010/0190033 | A1 | 7/2010 | Jin et al. |
| 2010/0258782 | A1 * | 10/2010 | Kuse et al. ................ 257/4 |
| 2011/0097843 | A1 | 4/2011 | Jin et al. |
| 2011/0220862 | A1 | 9/2011 | Arita et al. |
| 2011/0294259 | A1 | 12/2011 | Kanzawa et al. |
| 2012/0012807 | A1 * | 1/2012 | Yamaguchi et al. ............ 257/4 |
| 2012/0032132 | A1 * | 2/2012 | Lee et al. ................ 257/4 |
| 2012/0104350 | A1 | 5/2012 | Himeno et al. |
| 2012/0161095 | A1 | 6/2012 | Mikawa et al. |
| 2012/0217461 | A1 | 8/2012 | Kobayashi et al. |

FOREIGN PATENT DOCUMENTS

| | | |
|---|---|---|
| JP | 2010-021381 | 1/2010 |
| JP | 2010-028001 | 2/2010 |
| JP | 2012-191184 | 10/2012 |
| WO | 2006/009218 | 1/2006 |
| WO | 2008/059701 | 5/2008 |
| WO | 2008/062688 | 5/2008 |
| WO | 2008/149484 | 12/2008 |
| WO | 2010/079827 | 7/2010 |
| WO | 2011/007538 | 1/2011 |
| WO | 2011/024455 | 3/2011 |
| WO | 2011/135843 | 11/2011 |
| WO | 2011/161936 | 12/2011 |

* cited by examiner

NONVOLATILE SEMICONDUCTOR MEMORY DEVICE AND METHOD OF MANUFACTURING THE SAME

TECHNICAL FIELD

The present invention relates to nonvolatile semiconductor memory devices including variable resistance elements, and particularly relates to a configuration of a nonvolatile semiconductor memory device which is superior in operation stability, and to a method of manufacturing such a nonvolatile semiconductor memory device.

BACKGROUND ART

With the progress of the digital technology of electronic devices in recent years, nonvolatile semiconductor memory devices with a large capacity have been actively developed for storing data, such as music, images, and information. For example, nonvolatile semiconductor memory devices which use ferroelectrics as capacity elements have already been used in many fields. Furthermore, other than the nonvolatile semiconductor memory device which uses such a ferroelectric capacitor, a variable resistance nonvolatile semiconductor memory device (hereinafter referred to as a ReRAM) including a variable resistance element whose resistance value changes in response to an electric pulse application and which holds the state has been attracting attention in that it is easy to ensure consistency with a general semiconductor manufacturing process.

A cross point ReRAM has been proposed as a variable resistance nonvolatile semiconductor memory device in order to reduce size and increase capacity (e.g., see patent literature (PTL) 1). Patent literature 1 discloses a nonvolatile semiconductor memory device having a configuration in which a diode is placed in series with respect to a variable resistance layer. This is for avoiding effects from variable resistance layers in other rows or columns, when the resistance values of the variable resistance layers formed at cross-points where lines for rows and columns cross are read. According to PTL 1, at least one layer among an electrode layer and an insulating layer (or a semiconductor layer) included in a diode that is a non-ohmic element is embedded in a contact hole formed in an interlayer insulating film. With this, a surface which is in the same plane as the interlayer insulating film and is significantly smooth can be formed, which makes it possible for the non-ohmic element to have a good interface state. As a result, according to PTL 1, it is possible to reduce decrease or variation in a breakdown voltage due to an electric field concentration or the like, and increase a current capacity.

CITATION LIST

Patent Literature

[PTL 1]
International Publication WO 2008/062688
[PTL 2]
International Publication WO 2008/059701

SUMMARY OF INVENTION

Technical Problem

In the above-described PTL 1, part of a non-ohmic element having an MIM configuration is embedded in a memory plug. The process of embedding requires (1) a process which includes: chemical mechanical polishing (CMP) to remove a variable resistance layer that is deposited other than in a contact hole; and a removal of a portion of the variable resistance layer inside the contact hole to form a recess using a method, such as over-polishing, (2) a process of depositing an electrode layer, and (3) a process of removing, by CMP, the electrode layer formed other than in the contact hole.

Typically, the CMP process is a process in which a metal (an electrode in this case) material to be polished is polished with an abrasive called slurry, during which oxidation takes place. This causes a problem that a degraded layer is formed (hereafter, a degraded layer, which is an oxidized portion on the surface of the electrode material, is referred to as an "oxidatively degraded layer"). In addition, the CMP process is performed at an atmospheric pressure, and thus the electrode material that is polished is exposed to the atmosphere after the CMP process. Thus, further oxidation of the surface is of concern. As a result, when a variable resistance element is provided on the electrode layer that is planarized with the CMP process, the oxidatively degraded layer exists near the interface between the electrode layer and the variable resistance layer. Thus, the oxidatively degraded layer becomes a parasitic resistance component, reducing a voltage applied to the variable resistance element. As a result, a current value of the variable resistance element in a low resistance state decreases and thus a window of operation for writing is reduced, adversely affecting the stable operation. Here, the window (or a window of operation) refers to the difference between the resistance value of the variable resistance element in a high resistance state (e.g., the smallest resistance value that can be taken) and the resistance vale in a low resistance state (e.g., the largest resistance value that can be taken).

Furthermore, an oxidation-reduction reaction is considered as one of the mechanisms of a resistance changing phenomenon of a metal oxide (e.g., see PTL 2). For example, when an upper electrode layer comprises a material, such as platinum or iridium, having a high standard electrode potential (an index indicating how easily the material is oxidized and reduced), oxidation and reduction reaction occurs at the interface between the upper electrode layer and the variable resistance layer (e.g., a tantalum oxide), the transfer of oxygen occurs, and a resistance changing phenomenon occurs. However, in the case of the variable resistance element having the above-described oxidatively degraded layer, there is a possibility that a sufficient voltage is not applied to the variable resistance element depending on a resistance value of the parasitic resistance component of the oxidatively degraded layer. This causes forming process, which is for starting an oxidation and reduction reaction, to be insufficient, and there is possibility that a stable resistance change cannot be performed. In addition, there is a concern that repeated writing operations lead to insufficient extraction of oxygen in the lower electrode and an increase in an oxygen concentration of the variable resistance layer, stopping the resistance changing phenomenon to degrade endurance. Note that, the forming process is an initialization process (also referred to as breakdown) which is performed on the variable resistance element after being manufactured. With this, the variable resistance element is changed into a state in which the change between the high resistance state and the low resistance state is possible. Furthermore, the endurance is dependency of the nonvolatile semiconductor memory device on the repetition of writing operation.

The present invention is conceived to solve the above-described conventional problems and has as an object to provide a nonvolatile semiconductor memory device which includes a variable resistance element that has small variation in characteristics, is capable of stable operation, has superior endurance, has a large capacity, and is suitable for high integration, which is made possible by reducing a parasitic resistance between the lower electrode and the variable resistance layer included in the variable resistance element, and a method of manufacturing such a nonvolatile semiconductor memory device.

Solution to Problem

In order to achieve the aforementioned object, an aspect of a variable resistance nonvolatile semiconductor memory device according to the present invention is a variable resistance nonvolatile semiconductor memory device which includes: a substrate; and a variable resistance element formed on the substrate, having a resistance value which changes in response to application of an electric pulse, and holding the changed resistance value, wherein the variable resistance element includes (i) a lower electrode layer formed on the substrate, (ii) a variable resistance layer formed on the lower electrode layer and including a metal oxide, and (iii) an upper electrode layer formed on the variable resistance layer, the lower electrode layer includes at least a first conductive layer and a second conductive layer which is formed on the first conductive layer and is in contact with the variable resistance layer, and the first conductive layer includes an oxidatively degraded layer which is formed on an upper surface of the first conductive layer due to oxidization of the first conductive layer.

Furthermore, an aspect of a method of manufacturing a variable resistance nonvolatile semiconductor memory device according to the present invention is a method of manufacturing a variable resistance nonvolatile semiconductor memory device, the method including forming, on a substrate, a variable resistance element having a resistance value which changes in response to application of an electric pulse, and holding the changed resistance value, wherein the forming includes: forming a lower electrode layer on the substrate; forming, on the lower electrode layer, a variable resistance layer including a metal oxide; and forming an upper electrode layer on the variable resistance layer, the lower electrode layer includes at least a first conductive layer and a second conductive layer which is formed on the first conductive layer and is in contact with the variable resistance layer, the first conductive layer includes an oxidatively degraded layer which is formed on an upper surface of the first conductive layer due to oxidization of the first conductive layer, and the second conductive layer and the variable resistance layer are continuously formed without being exposed to an atmosphere.

Note that, the above-described objects, other objects, features, and advantages of the present invention will be apparent from the detailed descriptions of preferred embodiments below with reference to the accompanying drawings.

Advantageous Effects of Invention

With the present invention, a parasitic resistance between the lower electrode and the variable resistance layer which are included in the variable resistance element is reduced, and thus a nonvolatile semiconductor memory device including a variable resistance element which has small variation in characteristics, is capable of stable operation, has superior resistance against deterioration of endurance, has a large capacity, and is suitable for high integration is realized.

Therefore, the practical value of the present invention is very high today since there is a widespread use of electronic devices which require nonvolatile semiconductor memory devices that are small and have large capacity.

DESCRIPTION OF EMBODIMENTS

Summary of the Present Invention

Figure 1A:
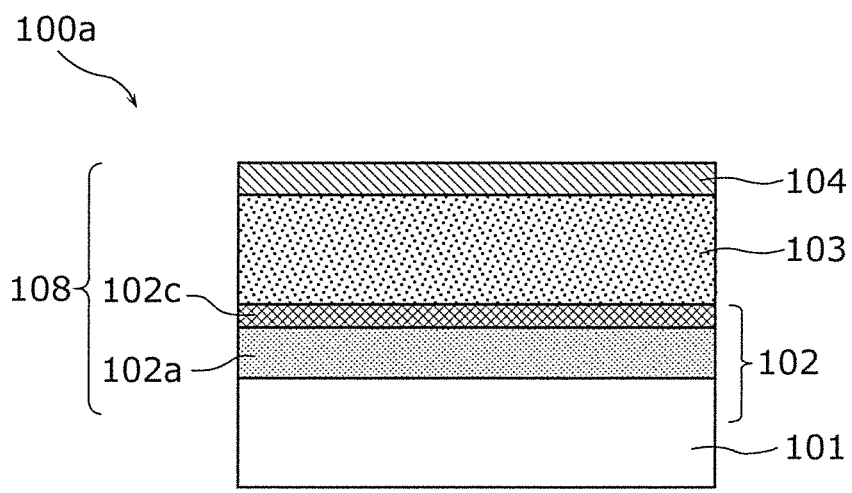
[FIG. 1A] is a cross-sectional view showing a first configuration example of a variable resistance nonvolatile semiconductor memory device according to Embodiment 1 of the present invention.

In order to achieve the aforementioned object, an aspect of a variable resistance nonvolatile semiconductor memory device according to the present invention is a variable resistance nonvolatile semiconductor memory device which includes: a substrate; and a variable resistance element formed on the substrate, having a resistance value which changes in response to application of an electric pulse, and holding the changed resistance value, wherein the variable resistance element includes (i) a lower electrode layer formed on the substrate, (ii) a variable resistance layer formed on the lower electrode layer and including a metal oxide, and (iii) an upper electrode layer formed on the variable resistance layer, the lower electrode layer includes at least a first conductive layer and a second conductive layer which is formed on the first conductive layer and is in contact with the variable resistance layer, and the first conductive layer includes an oxidatively degraded layer which is formed on an upper surface of the first conductive layer due to oxidization of the first conductive layer.

With this, the lower electrode layer includes at least the first conductive layer and the second conductive layer, and the second conductive layer and the variable resistance layer are in contact with each other. Thus, the variable resistance layer and the oxidatively degraded layer that is naturally formed in a planarization process or the like of the lower electrode do not contact each other. This prevents the occurrence of a parasitic resistance component due to contact resistance at the interface between the lower electrode layer and the variable resistance layer. As a result, in the nonvolatile semiconductor memory device, a current value when the variable resistance layer is in a low resistance state improves. Therefore, the difference between a current value in a low resistance state and a current value in a high resistance state increases, namely, a window of operation is enlarged. This is effective for stable operation and improving dependency on the number of writing operations (endurance) of the device. More specifically, the oxidatively degraded layer does not become a parasitic resistance component, and thus decrease in a current value when the variable resistance layer is in a low resistance state can be prevented. Furthermore, the window of operation can be enlarged, and a stable driving can be achieved. In addition, stability of operation in the case of repeated writing improves.

Furthermore, regarding an oxygen content in the vicinity of interface between the variable resistance layer and the second conductive layer, an oxygen content in vicinity of an interface between the variable resistance layer and the second conductive layer may be smaller than an oxygen content in vicinity of an interface between the second conductive layer and the first conductive layer. With the existence of the second conductive layer, it is possible to avoid the formation of the oxidatively degraded layer at the interface between the lower electrode layer and the variable resistance layer, and the probability of occurrence of a parasitic resistance component can be reduced.

Furthermore, the second conductive layer and the variable resistance layer may be continuously formed without being exposed to an atmosphere. With this, the second conductive layer and the variable resistance layer are continuously formed, which prevents the oxidatively degraded layer from being formed between the layers. Since the second conductive layer and the variable resistance layer are directly in contact with each other, it is possible to avoid the occurrence of a parasitic resistance component in the variable resistance element.

The variable resistance nonvolatile semiconductor memory device may further include a non-ohmic element formed on the upper electrode layer, wherein the non-ohmic element may include (i) a first electrode layer formed on the upper electrode layer, (ii) a semiconductor layer or an insulating layer formed on the first electrode layer, and (iii) a second electrode layer formed on the semiconductor layer or the insulating layer. With this, the variable resistance nonvolatile semiconductor memory device has a structure in which a non-ohmic element including (i) the first electrode layer, (ii) the semiconductor layer or the insulating layer, and (iii) the second electrode layer is connected to the variable resistance element in series. Thus, when a plurality of elements are included (i.e., when a memory cell array includes a plurality of variable resistance elements), the non-ohmic element functions as a switch element, making it possible to prevent crosstalk. More specifically, a cross point nonvolatile semiconductor memory device which is small and has increased capacity can be realized.

The variable resistance layer may be an oxygen-deficient metal oxide, and may include a first variable resistance layer and a second variable resistance layer which are metal oxides having a different degree of oxygen deficiency. With this, a resistance changing phenomenon occurs more reliably due to an oxidation-reduction reaction.

Furthermore, an aspect of a method of manufacturing a variable resistance nonvolatile semiconductor memory device according to the present invention is a method of manufacturing a variable resistance nonvolatile semiconductor memory device, the method including forming, on a substrate, a variable resistance element having a resistance value which changes in response to application of an electric pulse, and holding the changed resistance value, wherein the forming includes: forming a lower electrode layer on the substrate; forming, on the lower electrode layer, a variable resistance layer including a metal oxide; and forming an upper electrode layer on the variable resistance layer, the lower electrode layer includes at least a first conductive layer and a second conductive layer which is formed on the first conductive layer and is in contact with the variable resistance layer, the first conductive layer includes an oxidatively degraded layer which is formed on an upper surface of the first conductive layer due to oxidization of the first conductive layer, and the second conductive layer and the variable resistance layer are continuously formed without being exposed to an atmosphere. As described above, in a process of forming the variable resistance layer, it is possible to continuously form the second conductive layer and the variable resistance layer without exposure to the atmosphere, for example by continuously forming the second conductive layer and the variable resistance layer in the same apparatus. Thus, it is possible to avoid the occurrence of a parasitic resistance component at the interface between the second conductive layer and the variable resistance layer. As a result, it is possible to prevent a decrease in a current value when the variable resistance layer is in a low resistance state. Furthermore, the window of operation can be enlarged, and a stable driving can be achieved. In addition, stability of operation in the case of repeated writing improves.

Furthermore, according to the present invention, the forming of a lower electrode layer may include: forming, on the substrate, a lower electrode material layer which is for forming the first conductive layer; forming the first conductive layer which includes, on its upper surface, the oxidatively degraded layer by performing chemical mechanical polishing on the lower electrode material layer; and forming the second conductive layer on the first conductive layer. Even when the oxidatively degraded layer is formed as described above, the second conductive layer and the variable resistance layer are continuously formed without exposure to the atmosphere, for example by continuously forming the second conductive layer and the variable resistance layer in a same apparatus. This makes it possible to avoid the contact between the oxidatively degraded layer and the variable resistance layer. As a result, the oxidatively degraded layer does not become a parasitic resistance component, and thus decrease in a current value when the variable resistance layer is in a low resistance state can be prevented. Furthermore, the window of operation can be enlarged, and a stable driving can be achieved. In addition, stability of operation in the case of repeated writing improves.

Furthermore, the method may further include forming lower electrode lines in a stripe pattern on the substrate; forming an interlayer insulating layer on the substrate including surfaces of the lower electrode lines; forming, in the interlayer insulating layer, contact holes at positions facing the lower electrode lines; forming, on the upper electrode layer, a first electrode layer which is to be a part of a non-ohmic element; forming, on the first electrode layer, a semiconductor layer or an insulating layer which is to be a part of the non-ohmic element; and forming, on the semiconductor layer or the insulating layer, second electrode layers each of which is to be a part of the non-ohmic element, the second electrode layers being in a stripe pattern and three-dimensionally crossing the lower electrode lines, wherein in the forming of a lower electrode material layer, the lower electrode material layer may be formed on the contact holes and the interlayer insulating layer, and in the performing of chemical mechanical polishing, the lower electrode material layer on the interlayer insulating layer may be removed. With this, the non-ohmic element is connected to the variable resistance element. This makes it possible to realize a cross point nonvolatile semiconductor memory device which can operate stably. More specifically, the second conductive layer and the variable resistance layer are continuously formed without exposure to the atmosphere, for example by continuously forming the second conductive layer and the variable resistance layer in a same apparatus. This makes it possible to avoid a contact between (i) the oxidatively degraded layer formed due to oxidation of the electrode material in a planarization process and (ii) the variable resistance layer. As a result, the oxidatively degraded layer does not become a parasitic resistance component, and thus a decrease in a current value when the variable resistance layer is in a low resistance state can be prevented. Furthermore, while performing a planarization process, such as a CMP, for miniaturization, the window of operation of the nonvolatile semiconductor memory device can be enlarged at the same time. This makes it possible to achieve stable operation. In addition, stability of operation in the case of repeated writing improves.

Hereinafter, embodiments of the present invention shall be described with reference to the Drawings. It should be noted that the same elements are assigned the same reference signs and their descriptions may not be repeated. Furthermore, in the Drawings, the shapes of the transistor, the nonvolatile semiconductor memory device, and so on, are merely schematic, and their number, and so on, are set merely for convenient illustration. In other words, the embodiments described hereafter illustrate preferred specific examples of the present invention. Numerical values, shapes, materials, structural elements, the positioning and connection configuration of the structural elements, steps, the sequence of the steps, and so on, described in the embodiments below are merely examples and are not intended to limit the present invention. Furthermore, among the structural elements in the following embodiments, those structural elements which are not described in the independent claims indicating the broadest concept of the present invention are described as arbitrary structural elements for configuring a more preferable embodiment.

(Embodiment 1)

First, a variable resistance nonvolatile semiconductor memory device according to Embodiment 1 of the present invention is described.

FIG. 1A is a cross-sectional view showing an example of a configuration of a variable resistance nonvolatile semiconductor memory device 100a according to Embodiment 1 of the present invention.

As shown in FIG. 1A, the variable resistance nonvolatile semiconductor memory device 100a in Embodiment 1 includes (1) a substrate 101 and (2) a variable resistance element 108 which includes a lower electrode layer 102, an upper electrode layer 104, and a variable resistance layer 103 that is positioned between the two electrodes.

The lower electrode layer 102 includes at least (1) a first conductive layer 102a and (2) a second conductive layer 102c which is formed on the first conductive layer 102a, is in contact with the variable resistance layer 103, and is for stabilizing the interface between the lower electrode layer 102 and the variable resistance layer 103. Here, the lower electrode layer 102 comprises a tantalum nitride, titanium nitride, or the like. Furthermore, the first conductive layer 102a and the second conductive layer 102c may comprise the same material but need not necessarily comprise the same material. For example, the first conductive layer 102a may comprise the tantalum nitride, while the second conductive layer 102c may comprise the titanium nitride. It should be noted that, as described later, the second conductive layer 102c and the variable resistance layer 103 are continuously formed in one apparatus without being exposed to the atmosphere.

The variable resistance layer 103 included in the variable resistance element 108 comprises an oxygen-deficient metal oxide, such as an oxygen-deficient tantalum oxide. Here, when the metal oxide is denoted as $MO_x$ where the metal is M, oxygen is O, and x is composition of oxygen O, the oxygen-deficient metal oxide is an oxide of a composition having a smaller x than a stoichiometrically stable composition. Use of the variable resistance layer comprising the above-described oxygen-deficient metal oxide makes it possible to obtain a nonvolatile semiconductor memory device that uses a resistance changing phenomenon and having reversible and stable writing characteristics. This is described in detail in PTL 2 as a relevant patent.

Figure 1B:
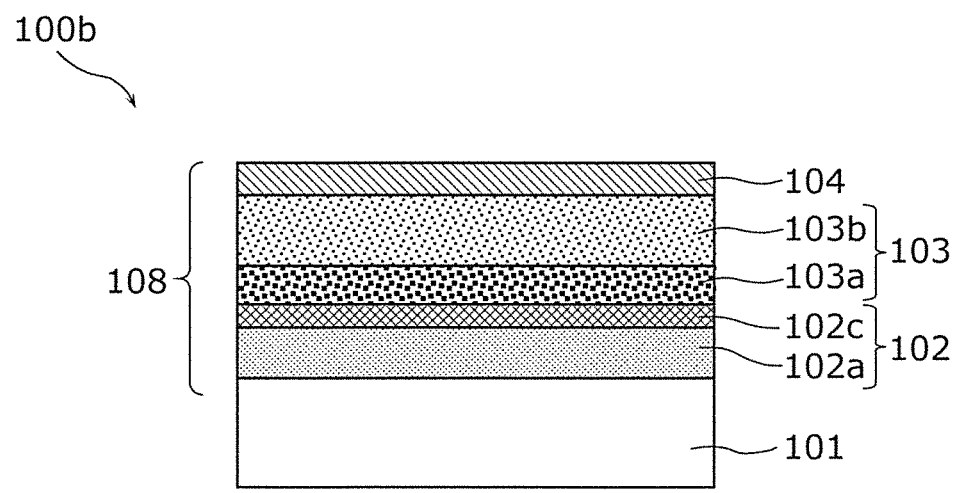
[FIG. 1B] is a cross-sectional view showing a second configuration example of the variable resistance nonvolatile semiconductor memory device according to Embodiment 1 of the present invention.

Note that, FIG. 1B shows another configuration of the nonvolatile semiconductor memory device that is a nonvolatile semiconductor memory device 100b. As shown, the variable resistance layer 103 may include two layers, namely, a high-concentration-oxygen containing layer (a second variable resistance layer 103b) and a low-concentration-oxygen containing layer (a first variable resistance layer 103a), and the high-concentration-oxygen containing layer (the second variable resistance layer 103b) may be positioned on the side connected to the upper electrode layer 104. In other words, the variable resistance layer 103 may include the first variable resistance layer 103a and the second variable resistance layer 103b which are metal oxides having a different degree of oxygen deficiency.

International Publication WO 2008/149484 (PTL 3) describes in detail the embodiment in which the variable resistance layer has two layers that are stacked. In this embodiment, the oxygen content atomic percentage of the first variable resistance layer (low-concentration-oxygen containing layer) 103a is in the range of 44.4 to 65.5 atm %, and the oxygen content atomic percentage of the second variable resistance layer (high-concentration-oxygen containing layer) 103b is in the range of 67.7 to 71.4 atm %. This is to facilitate the occurrence of a resistance change due to oxidation and reduction at the interface between the upper electrode layer 104 and the second variable resistance layer 103b, by designing the oxygen content atomic percentage to be high in the vicinity of the upper electrode layer 104. With this, good memory cell characteristics that enable low voltage driving can be obtained.

Here, "degree of oxygen deficiency" refers to the percentage of deficient oxygen with respect to the amount of oxygen comprising an oxide of the stoichiometric composition (in the case where there are plural stoichiometric compositions, the stoichiometric composition having the highest resistance value among the stoichiometric compositions) in the metal oxide. Compared to a metal oxide with another composition, a metal oxide having a stoichiometric composition is more stable and has a higher resistance value. For example, when the metal is tantalum (Ta), the oxide having the stoichiometric composition according to the above-described definition is $Ta_2O_5$, and thus can be expressed as $TaO_{2.5}$. The degree of oxygen deficiency of $TaO_{2.5}$ is 0%, and the degree of oxygen deficiency of $TaO_{1.5}$ becomes: degree of oxygen deficiency=(2.5−1.5)/2.5=40%. Furthermore, a metal oxide having excess oxygen has a degree of oxygen deficiency with a negative value. It should be noted that in this Description, unless stated otherwise, the degree of oxygen deficiency includes positive values, 0 (zero), and negative values.

Furthermore, "oxygen content atomic percentage" of an oxide is a percentage of the oxygen atoms to the total number of atoms. For example, the oxygen content atomic percentage (O/(Ta+O)) of $Ta_2O_5$ that is a stoichiometric composition is 71.4%. Accordingly, the oxygen-deficient tantalum oxide has an oxygen content atomic percentage that is greater than 0% and smaller than 71.4%. Note that, when the metal included in the first variable resistance layer 103a and the metal included in the second variable resistance layer 103b comprise the same constituent metal, the oxygen content atomic percentage corresponds with the degree of oxygen deficiency. More specifically, when the oxygen content atomic percentage of the second variable resistance layer 103b is greater than the oxygen content atomic percentage of the first variable resistance layer 103a, the degree of oxygen deficiency of the second variable resistance layer 103b is smaller than the degree of oxygen deficiency of the first variable resistance layer 103a. Here, the higher the oxygen content atomic percentage of the metal oxide comprised in the variable resistance element is, the higher the resistance value is.

The upper electrode layer 104 included in the variable resistance element 108 comprises platinum (Pt), iridium (Ir), palladium (Pd), or the like. The standard electrode potentials of platinum and iridium are approximately +1.2 eV. Generally, the standard electrode potential is an index that indicates how easily a material is oxidized. The higher the value is, the less oxidizable a material is, and the lower the value is, the more oxidizable a material is. The greater the difference in the standard electrode potential between the electrode and the variable resistance layer is, the more easily a change in resistance can occur. As the difference becomes smaller, the more difficult it is for a change in resistance to occur. Thus, it can be inferred that a tendency to oxidize plays a large role in the mechanism of the resistance changing phenomenon. The standard electrode potential that indicates the tendency to oxidize or reduce of tantalum is −0.6 eV, which is smaller than the standard electrode potentials of platinum and iridium. Thus, in the variable resistance layer 103 in the vicinity of the interface between (i) the upper electrode layer 104 comprising platinum or iridium and (ii) the variable resistance layer 103, an oxidation and reduction reaction occurs, oxygen is transferred, and a resistance changing phenomenon occurs.

Furthermore, the lower electrode layer 102 connected to the first variable resistance layer 103a having higher degree of oxygen deficiency may comprise a material having a lower standard electrode potential, such as tungsten (W), nickel (Ni), tantalum (Ta), titanium (Ti), aluminum (Al), tantalum nitride (TaN), and titanium nitride (TiN), compared to the metal comprised in the first variable resistance layer 103a. Specifically, the relationships $V_{r2} < V_2$ and $V_1 < V_2$ may be satisfied, where V2 represents the standard electrode potential of the upper electrode layer 104, Vr2 represents the standard electrode potential of the metal comprised in the second variable resistance layer 103b, and Vr1 represents the standard electrode potential of the metal comprised in the first variable resistance layer 103a, and V1 represents the standard electrode potential of the lower electrode layer 102. In addition, the relationships V2>Vr2 and Vr1 V1 may be satisfied. With this structure, in the second variable resistance layer 103b, an oxidation-reduction reaction selectively occurs in the vicinity of the interface between the upper electrode layer 104 and the second variable resistance layer 103b, and a stable resistance changing phenomenon can be realized.

Note that, a metal other than tantalum may be used as the metal comprised in the first variable resistance layer 103a and the second variable resistance layer 103b. A metal comprised in the variable resistance layer 103 may be a transition metal or aluminum (Al). For example, tantalum (Ta), titanium (Ti), hafnium (Hf), zirconium (Zr), niobium (Nb), tungsten (W), or nickel (Ni) can be used as the transition metal. Since transition metals can take a plurality of oxidation states, different resistance states can be realized by an oxidation-reduction reaction.

As described, by configuring the variable resistance layer 103 with a stacked structure of (i) the second variable resistance layer 103b having high resistance and thin thickness and (ii) the first variable resistance layer 103a having low resistance, it is possible to facilitate the oxidation-reduction reaction which occurs in the second variable resistance layer 103b because the voltage applied to the variable resistance element 108 is distributed more to the second variable resistance layer 103b having higher resistance.

In addition, a first metal comprised in the first variable resistance layer 103a may be a different material from a second metal comprised in the second variable resistance layer 103b. In this case, it is preferable that the second variable resistance layer 103b has smaller degree of oxygen deficiency, that is, has higher resistance than the first variable resistance layer 103a. With this configuration, the voltage applied between the upper electrode layer 104 and the lower electrode layer 102 at the time of resistance change is distributed more to the second variable resistance layer 103b, and thus the oxidation-reduction reaction which occurs in the second variable resistance layer 103b is facilitated.

Furthermore, when the first metal and the second metal comprise a different material, it is preferable that the standard electrode potential of the second metal be lower than the standard electrode potential of the first metal. It is believed that an oxidation-reduction reaction occurs in a small filament formed in the second variable resistance layer 103b having high resistance, causing a change in the resistance value of the second variable resistance layer 103b, and thus the resistance changing phenomenon occurs. A stable resistance change operation is achieved when the first variable resistance layer 103a comprises an oxygen-deficient tantalum oxide and the second variable resistance layer 103b comprises a titanium oxide ($TiO_2$), for example. Titanium (standard electrode potential=−1.63 eV) is a material having a lower standard electrode potential than tantalum (standard electrode potential=−0.6 eV). The higher the standard electrode potential of a material is, the more difficult it is to oxidize the material. When an oxide of a metal having a smaller standard electrode potential than the first variable resistance layer 103a is provided in the second variable resistance layer 103b, occurrence of the oxidation-reduction reaction is more facilitated in the second variable resistance layer 103b.

More specifically, it is conceivable that the above-described resistance changing phenomenon in the variable resistance layer 103 having a stacked structure is a change in resistance value of the variable resistance layer 103 caused by change in filaments (conductive paths) in a local region due to an oxidation-reduction reaction that is assumed to occur in a small local region formed in the second variable resistance layers 103b having a high resistance.

For example, when a voltage that is positive with respect to the voltage of the lower electrode layer 102 is applied to the upper electrode layer 104 connected to the second variable resistance layer 103b, oxygen ions in the variable resistance layer 103 are pulled toward the second variable resistance layer 103b-side. With this, an oxidation reaction occurs in the small local region formed in the second variable resistance layer 103b, and the degree of oxygen deficiency decreases. As a result, it is believed that it becomes difficult for the filaments inside the local region to connect, increasing the resistance value.

Conversely, when a voltage that is negative with respect to the voltage of the lower electrode layer 102 is applied to the upper electrode layer 104 connected to the second variable resistance layer 103b, the oxygen ions in the second variable resistance layer 103b are pushed toward the first variable resistance layer 103a-side. With this, a reduction reaction occurs in the small local region formed in the second variable resistance layer 103b, and the degree of oxygen deficiency increases. As a result, it is believed that it becomes easy for the filaments inside the local region to connect, decreasing the resistance value.

Next, a method of manufacturing the nonvolatile semiconductor memory device 100a according to this embodiment is described. First, the first conductive layer 102a included in the lower electrode layer 102 is formed on the substrate 101, such as Si wafer. A Ti—Al—N alloy film is formed in this embodiment. Such a Ti—Al—N alloy film may be produced in a nitrogen gas atmosphere using a Ti—Al alloy target, for example, at room temperature condition, with the pressure of a chamber in the range of 0.03 Pa to 3 Pa, and the $Ar/N_2$ flow rate in the range of 20 sccm/5 sccm to 20 sccm/30 sccm. Ti—Al—N alloy film is superior in terms of flatness and strength of adhesion to the substrate.

Subsequently, on the first conductive layer 102a, the second conductive layer 102c and the variable resistance layer 103 are deposited continuously without exposure to the atmosphere. In this embodiment, a tantalum nitride film is formed as the second conductive layer 102c. Such a tantalum nitride film may be produced in a nitrogen gas atmosphere using a Ta target, for example, at a room temperature condition, with the pressure of a chamber in the range of 0.03 Pa to 3 Pa, and the $Ar/N_2$ flow rate in the range of 20 sccm/5 sccm to 20 sccm/30 sccm. As the variable resistance layer 103, a $TaO_x$ film is deposited on the second conductive layer 102c using a reactive sputtering method. Such a $TaO_x$ film may be produced in an oxygen gas atmosphere using a Ta target, for example, at a room temperature condition, with the pressure of a chamber in the range of 0.03 Pa to 3 Pa, and the $Ar/O_2$ flow rate in the range of 20 sccm/5 sccm to 20 sccm/30 sccm. Note that, the method for depositing these films is not limited to the sputtering method, but a CVD method or an atomic layer deposition (ALD) method may be used. The second conductive layer 102c includes the same element as the metal (Ta in this case) comprised in the variable resistance layer 103. This makes it possible to reduce the change in the interface profile caused by diffusion of metal elements in the variable resistance layer 103 due to repetition of writing operations of the variable resistance element 108.

When the second conductive layer 102c and the variable resistance layer 103 are formed using the above described manufacturing method, a parasitic resistance component is not formed at the interface between the layers. As a result, a current value of the variable resistance element 108 in a low resistance state increases, enlarging the window of operation. With this, the operation of the nonvolatile semiconductor memory device 100a becomes stable, and endurance on repeated writing also improves.

Lastly, the upper electrode layer 104 comprising platinum or iridium is formed using a DC sputtering method. The iridium film may be produced using an iridium target, for example, at a room temperature condition, with the pressure of a chamber in the range of 0.03 Pa to 3 Pa, and argon flow rate in the range of 20 sccm to 100 sccm.

Figure 2:
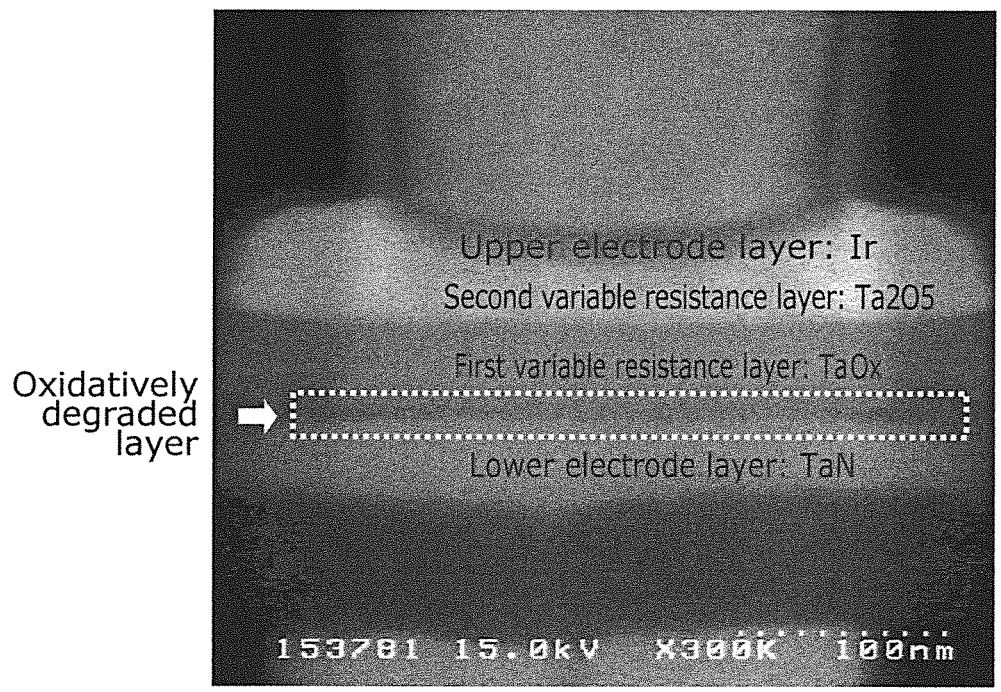
[FIG. 2] is a picture captured by a transmission electron microscope (TEM), showing a cross section of a variable resistance nonvolatile semiconductor memory device according to a comparative example in which the lower electrode layer is formed and exposed to the atmosphere, and then the variable resistance layer is formed.
Figure 3A:
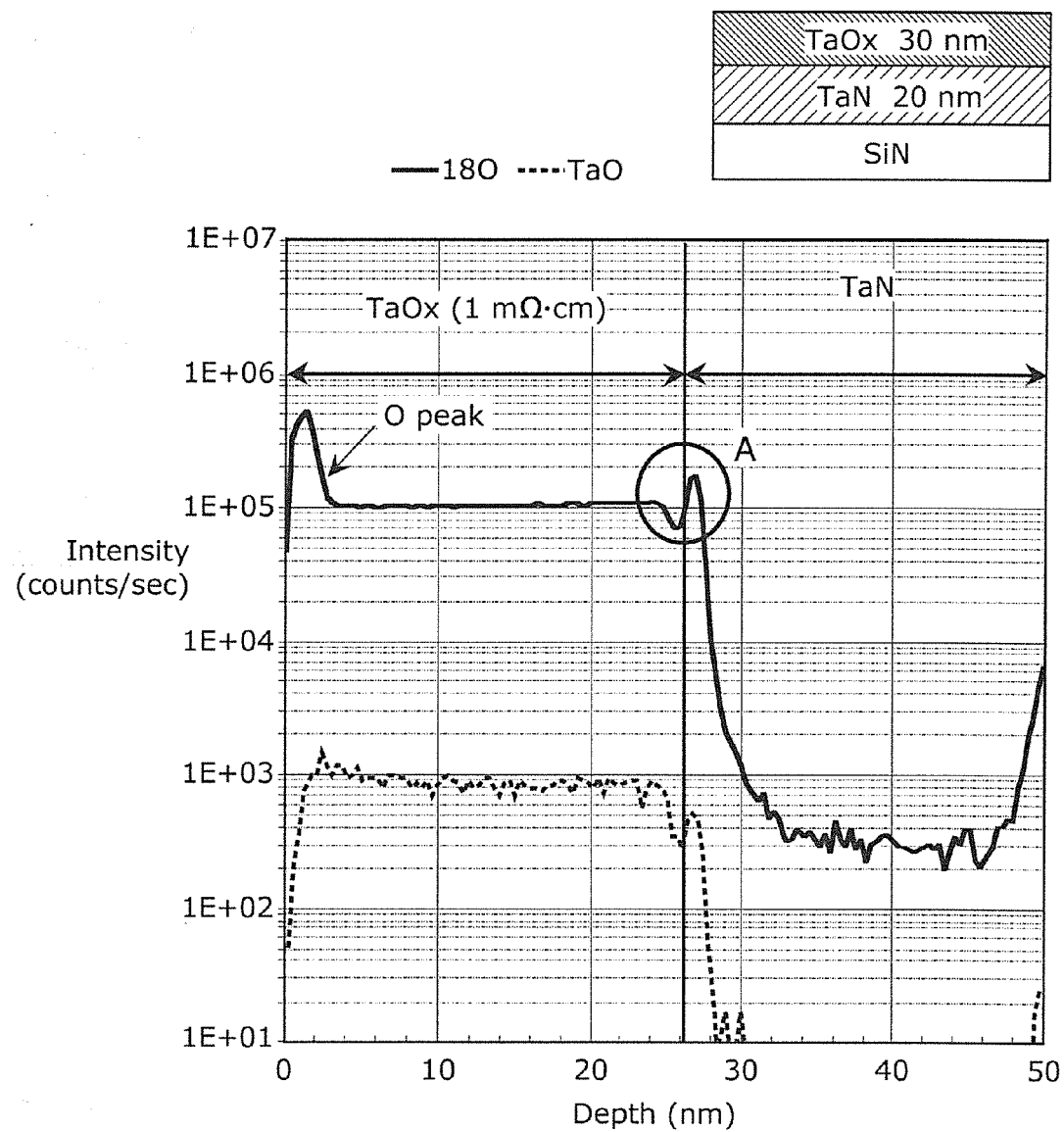
[FIG. 3A] is a diagram showing, in the film thickness direction, an oxygen profile of an analysis sample according to a comparative example in which the lower electrode layer is exposed to the atmosphere after its formation, and then the variable resistance layer is formed.
Figure 3B:
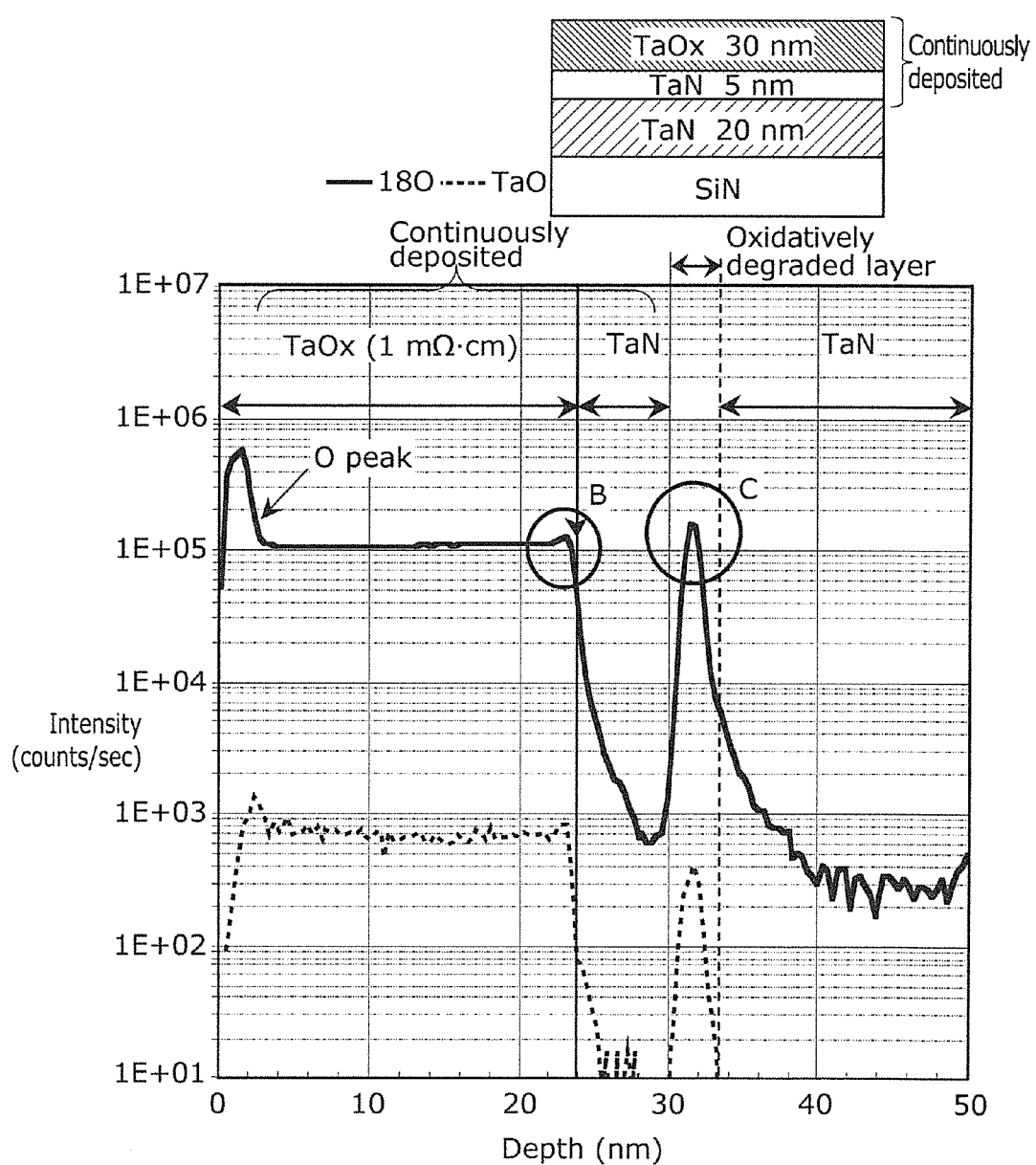
[FIG. 3B] is a diagram showing, in the film thickness direction, an oxygen profile of an analysis sample according to Embodiment 1 of the present invention in which the lower electrode layer and the variable resistance layer are continuously formed in the same apparatus.

As a comparative example for this embodiment, a nonvolatile semiconductor memory device is produced in which the lower electrode layer is exposed to the atmosphere once after its formation and then a variable resistance layer is formed using a separate apparatus. Then, the state of the comparative example is observed. FIG. 2 is a picture showing a cross section captured with a transmission electron microscope (TEM) which enlarges the variable resistance element according to a comparative example that is produced as described above. FIG. 2 shows that a layer having a different contrast (oxidatively degraded layer) exists in a single layer between TaN that is the lower electrode layer and $TaO_x$ layer that is the first variable resistance layer. It is inferred that the oxidatively degraded layer is an oxidized layer that is formed on the surface of the lower electrode due to exposure of the lower electrode layer to the atmosphere or performing of a CMP process that is a planarization process. Thus, an oxygen profile analysis of a film in the thickness direction is performed using a secondary ion mass spectrometer (SIMS) to examine the interface state. FIG. 3A and FIG. 3B show the results. Here, FIG. 3A is a diagram showing, in the film thickness direction, an oxygen profile of an analysis sample according to a comparative example in which the lower electrode layer is exposed to the atmosphere after its formation and then the variable resistance layer is formed. FIG. 3B is a diagram showing, in the film thickness direction, an oxygen profile of an analysis sample according to Embodiment 1 of the present invention in which the lower electrode layer (more precisely, the second conductive layer) and the variable resistance layer are continuously formed in the same apparatus. In each of FIG. 3A and FIG. 3B, the horizontal axis indicates a depth (nm) from the upper surface of the analysis sample, and the vertical axis indicates a concentration (intensity (counts/sec)) of a component. The solid line graph indicates an oxygen (O having a mass number of 18) profile, and the dotted line graph indicates a TaO profile.

As the cross sectional configuration diagram in the upper portion of FIG. 3A shows, the variable resistance element according to the comparative example is produced as follows: a TaN film which corresponds to the first conductive layer and has a thickness of 20 nm is formed on an Si wafer including an SiN; the formed TaN film is exposed to the atmosphere; and a $TaO_x$ film which corresponds to the variable resistance layer and has a thickness of 30 nm is formed. Note that, the specific resistance of the $TaO_x$ film in each of FIG. 3A and FIG. 3B is 1 mΩ·cm. The oxygen profile shown in FIG. 3A indicates that an oxygen peak exists in the TaN film near the $TaO_x$/TaN interface (portion A in the drawing). The oxygen peak intensity is $1.8 \times 10^5$ (counts/sec). As the cross sectional configuration diagram in an upper portion of FIG. 3B shows, the variable resistance element according to Embodiment 1 is produced as follows: a TaN film which corresponds to the first conductive layer and has a thickness of 20 nm is formed on an Si wafer including an SiN; the formed TaN film is exposed to the atmosphere; and then (i) a TaN film which corresponds to the second conductive layer and has a thickness of 5 nm and (ii) a $TaO_x$ film which corresponds to the variable resistance layer and has a thickness of 30 nm are continuously deposited using a same apparatus (i.e., without exposure to the atmosphere). According to the result of the SIMS analysis, an oxygen peak is observed (portion C in the drawing) at the interface between (i) the TaN film which corresponds to the first conductive layer and has a thickness of 20 nm and (ii) the TaN film which corresponds to the second conductive layer and has a thickness of 5 nm. The oxygen peak intensity is $1.5 \times 10^5$ (counts/sec). The oxygen peak (portion C in the drawing) is an oxygen peak in the oxidatively degraded layer that is formed by the oxidation of the upper surface of the TaN film which corresponds to the first conductive layer. In contrast, only a small oxygen peak is observed (portion B in the drawing) between (i) the TaN film which corresponds to the second conductive layer and has a thickness of 5 nm and (ii) the $TaO_x$ film that is the variable resistance layer, which are formed by continuous deposition.

FIG. 3A and FIG. 3B indicate that, in the nonvolatile semiconductor memory devices 100a and 100b according to this embodiment, the oxygen content (the oxygen content at the peak in the profile, namely, local largest value) in the vicinity of the interface between the variable resistance layer 103 and the second conductive layer 102c is smaller than the oxygen content (the oxygen content at the peak in the profile, namely, local largest value) in the vicinity of the interface (i.e., the oxidatively degraded layer that is an oxidized first conductive layer 102a) between the second conductive layer 102c and the first conductive layer 102a.

Furthermore, FIG. 3A shows that, compared to the case in which an oxide thin-film is formed (FIG. 3B) using a sputtering process while introducing oxygen, oxidization on the surface of the TaN film is greater when the TaN electrode film is naturally oxidized through exposure to the atmosphere. In the case of a process that uses a reactive sputtering method, it is inferred that oxidization state on the surface of the electrode changes according to a flow rate of oxygen introduced. The specific resistance of the $TaO_x$ film in each of FIG. 3A and FIG. 3B is 1 mΩ·cm. However, when a tantalum oxide film having high specific resistance is formed by increasing a flow rate of oxygen introduced at the time of deposition, it is expected that the oxygen peak intensity shown by portion B in FIG. 3B at the interface between the TaN having a thickness of 5 nm and the $TaO_x$ film that is a variable resistance layer which are formed by continuous deposition increases. Thus, when a tantalum oxide thin-film has composition in which an oxygen peak intensity is lower than $1.8 \times 10^5$ (counts/sec) shown by portion A in FIG. 3A, effect of continuous deposition of the second conductive layer and the variable resistance layer, namely, effect of reducing the influence from a parasitic resistance component originating from the oxidatively degraded layer is expected.

As described, in the nonvolatile semiconductor memory device 100a according to this embodiment, the second conductive layer 102c is formed at the position where the lower electrode layer 102 is in contact with the variable resistance layer 103. Thus, even when the oxidatively degraded layer is formed on the first conductive layer 102a, the effect from the parasitic resistance component originating from the oxidatively degraded layer is reduced, and a decrease in a voltage other than in the variable resistance element 108 can be prevented. As a result, a value of current which flows in the variable resistance element 108 increases when the variable resistance layer 103 is in a low resistance state. Thus, the window of operation is enlarged and operation is stabilized.

Note that, the nonvolatile semiconductor memory device according to this embodiment was evaluated by evaluating electrical characteristics in the case in which the variable resistance layer has a stacked structure of three layers that is $Ta_2O_5/TaO_x$ (15 mΩ·cm)/$TaO_z$ (1 mΩ·cm), the lower electrode layer is TaN, and the upper electrode layer is iridium.

Figure 4:
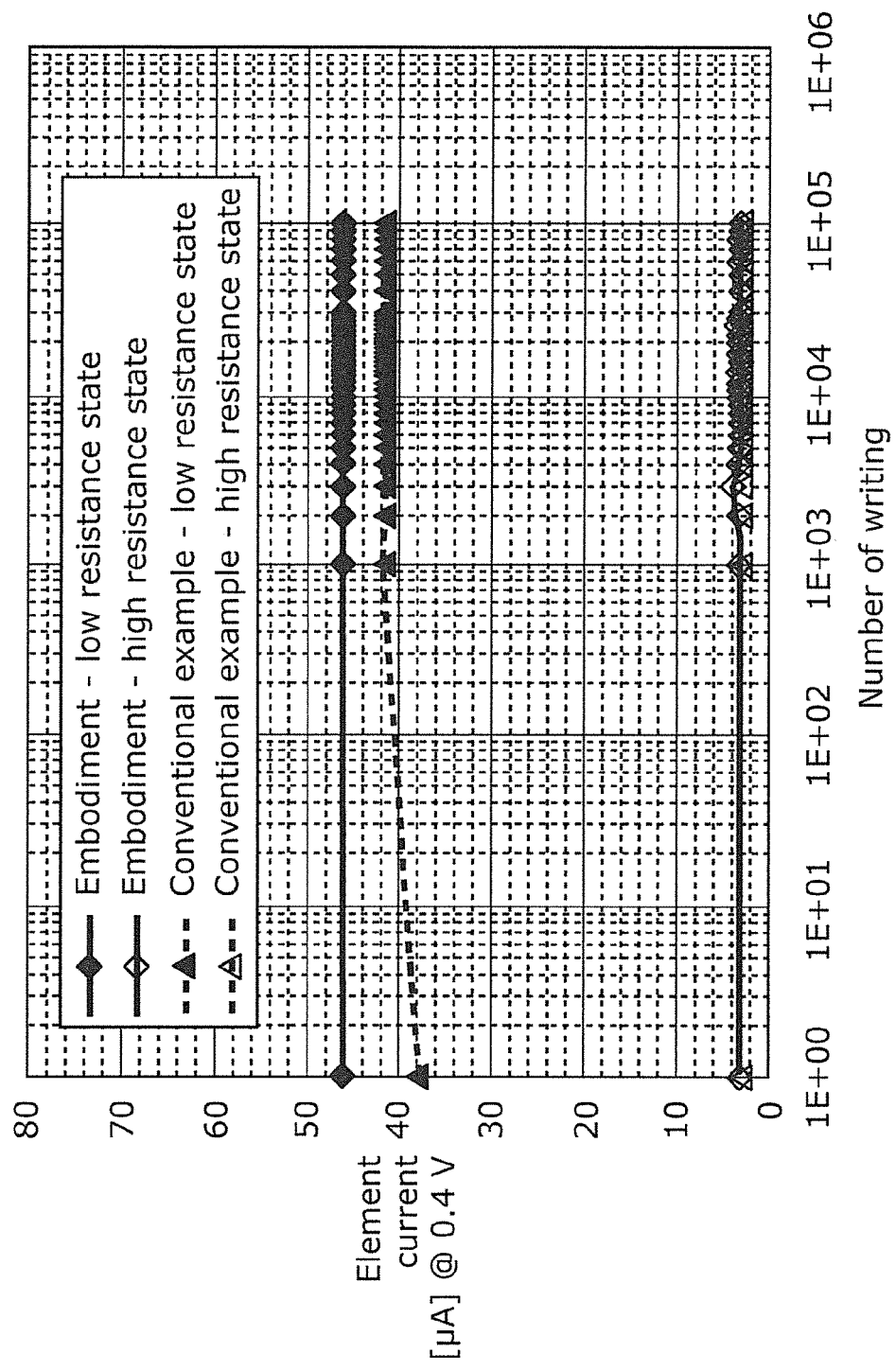
[FIG. 4] is a diagram showing an example of evaluation results (resistance characteristics, namely, a current that flows in the nonvolatile semiconductor memory device) of the nonvolatile semiconductor memory devices according to this embodiment and a conventional example.

FIG. 4 is a diagram showing an example of evaluation results (resistance characteristics, namely, a current that flows in the nonvolatile semiconductor memory device) of the nonvolatile semiconductor memory devices according to this embodiment and a conventional example. This example shows the resistance characteristics (a current that flows when read voltage of 0.4 V is applied) when writing to change the states alternately between a high resistance state and a low resistance state is repeatedly performed on (i) the nonvolatile semiconductor memory device according to the conventional example in which the variable resistance layer is formed after exposing the lower electrode layer to the atmosphere, and (ii) the nonvolatile semiconductor memory device according to this embodiment in which the second conductive layer and the variable resistance layer are continuously deposited in a same apparatus (i.e., without exposure to the atmosphere). Specifically, the horizontal axis indicates the number of operations of writing, and the vertical axis indicates a current value ("element current"). A black rhombus mark and a white rhombus mark respectively show, regarding the nonvolatile semiconductor memory device according to this embodiment, a current value in a low resistance state and a current value in a high resistance state. On the other hand, a black triangle mark and a white triangle mark respectively show, regarding the nonvolatile semiconductor memory device according to the conventional example, a current value in a low resistance state and a current value in a high resistance state.

The nonvolatile semiconductor memory device according to the conventional example in which the variable resistance layer is formed after the lower electrode layer (TaN thin-film) is exposed to the atmosphere has an initial current value of 38 μA in a low resistance state. On the other hand, the nonvolatile semiconductor memory device according to this embodiment in which the second conductive layer (TaN thin-film having a thickness of 5 nm) and the variable resistance layer ($TaO_x$) are continuously deposited in the same apparatus (i.e., without exposure to the atmosphere) has an initial current value of 46 μA in a low resistance state. It is believed that this (i.e., the nonvolatile semiconductor memory device according to this embodiment has a greater initial current value in a low resistance state) is so because the effects of introduction of the second conductive layer prevented the oxidatively degraded layer from becoming the parasitic resistance component.

Figure 5:
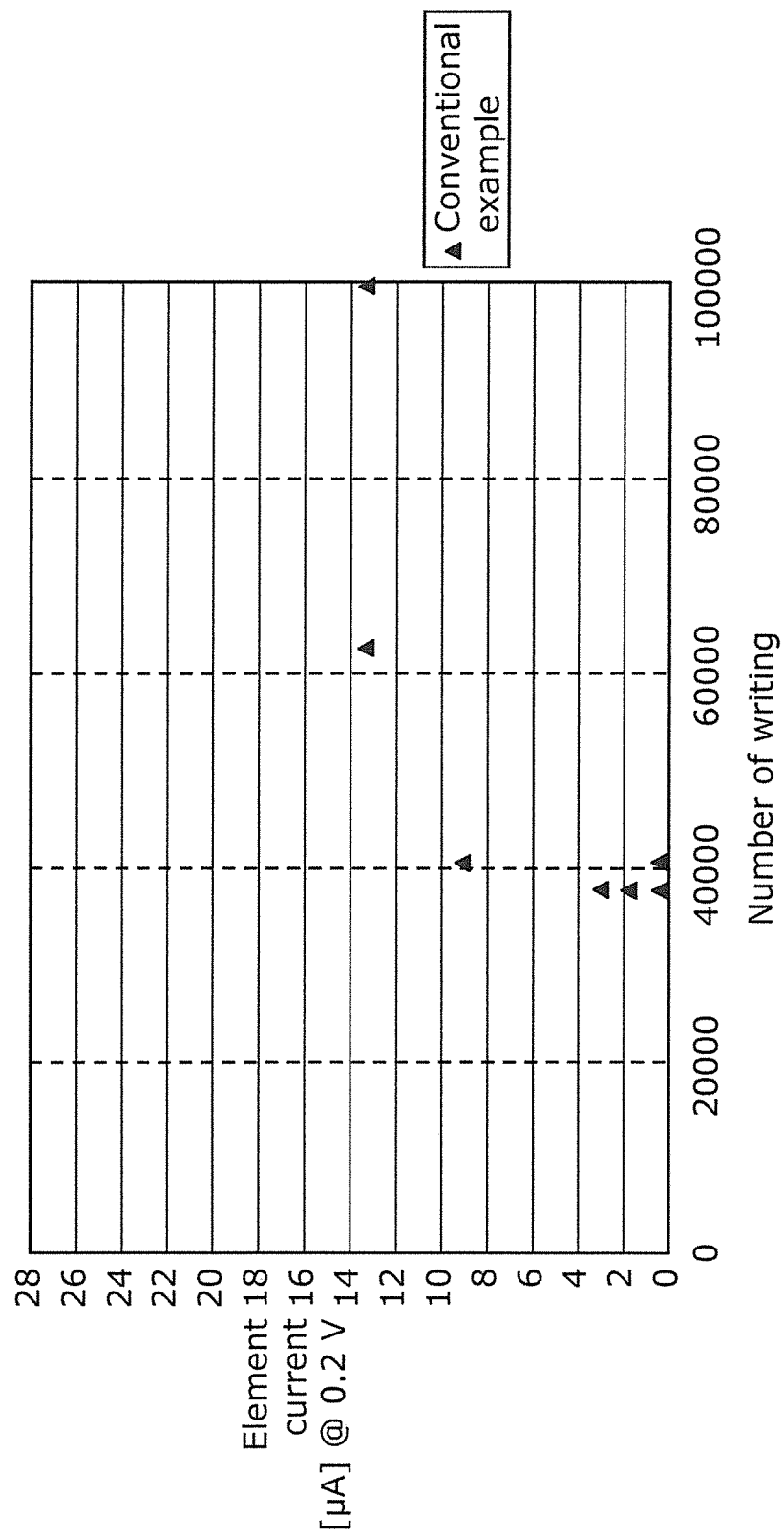
[FIG. 5] is a diagram showing an example of the evaluation result (endurance, namely, a current that flows in the nonvolatile semiconductor memory device when the writing is repeated) of the nonvolatile semiconductor memory devices according to this embodiment and the conventional example.

In addition, writing to change the states between the high resistance state and the low resistance state is continuously repeated for $10^5$ times to evaluate endurance. FIG. 5 is a diagram showing an example of the evaluation result (endurance, namely, a current that flows in the nonvolatile semiconductor memory device when the writing is repeated) of the nonvolatile semiconductor memory devices according to this embodiment and the conventional example. This example shows the current that flows in the low resistance state (a current that flows when read voltage of 0.2 V is applied) when writing to change the states alternately between a high resistance state and a low resistance state is repeatedly performed on (i) the nonvolatile semiconductor memory device according to the conventional example in which the variable resistance layer is formed after exposing the lower electrode layer to the atmosphere, and (ii) the nonvolatile semiconductor memory device according to this embodiment in which the second conductive layer and the variable resistance layer are continuously deposited in a same apparatus (i.e., without exposure to the atmosphere). Specifically, the horizontal axis indicates the number of operations of writing, and the vertical axis indicates a current value ("element current"). A black triangle mark indicates a current value of the nonvolatile semiconductor memory device according to the conventional example in a low resistance state. In this evaluation, 0.2 V is applied to the nonvolatile semiconductor memory device in a low resistance state. At this time, the reading reference of the element current that flows through the nonvolatile semiconductor memory device is set to 28 μA. This drawing shows measurement result of the element current value which is equal to or less than the reading reference. In the case of the nonvolatile semiconductor memory device according to the conventional example, the current value exceeded the reading reference (28 μA) with a low number of writing of little less than 40000 times. Thus, the black triangle mark is not plotted in FIG. 5 for the low number of writing up to a little less than 40000 times. Likewise, the current value of the nonvolatile semiconductor memory device according to this embodiment exceeded the reading reference of 28 μA all the time in the case of writing up to 100000 times, and thus is not plotted in FIG. 5.

Some measured points are plotted in FIG. 5. This indicates that a phenomenon that a resistance value is fixed at high resistance state was sometimes observed in the case of the nonvolatile semiconductor memory device according to the conventional example (black triangle marks) in which the oxidatively degraded layer is in contact with the variable resistance layer. In contrast, no measured points are plotted in FIG. 5 in the case of the nonvolatile semiconductor memory device according to this embodiment (black rhombus marks). This indicates that the phenomenon in which the resistance value is fixed at a high resistance state was not observed. As described, the nonvolatile semiconductor memory device according to this embodiment has good characteristics in that the endurance is also improved by reducing the effects of the parasitic resistance component.

Note that, although the nonvolatile semiconductor memory device in this embodiment includes the first conductive layer 102a comprising a Ti—Al—N alloy and the second conductive layer 102c comprising TaN, the materials are not limited to such examples.

(Embodiment 2)

Next, a variable resistance nonvolatile semiconductor memory device according to Embodiment 2 of the present invention is described. In Embodiment 1, an oxidatively degraded layer is not shown in a cross-sectional configuration diagram of the nonvolatile semiconductor memory device. In this embodiment, the oxidatively degraded layer is shown in a cross-sectional configuration diagram of the nonvolatile semiconductor memory device to provide description.

Figure 6A:
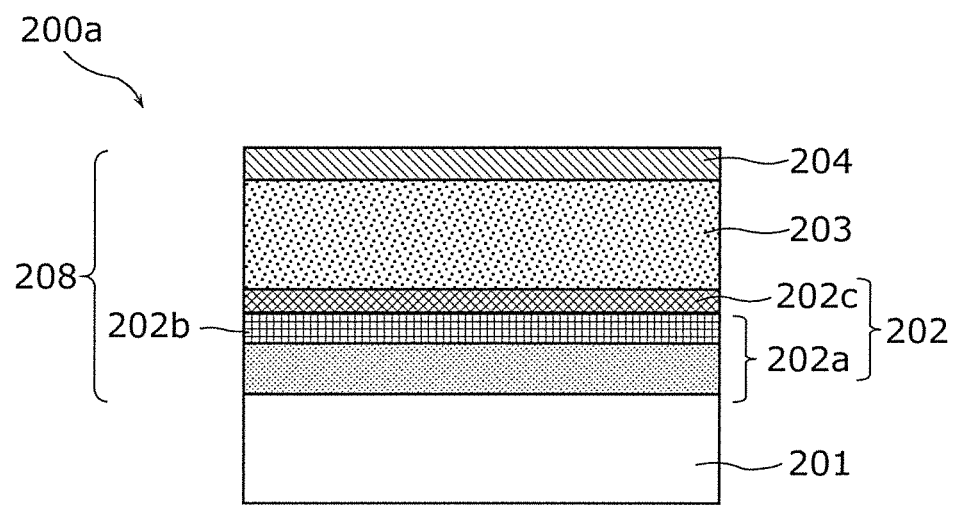
[FIG. 6A] is a cross-sectional view showing a first configuration example of a variable resistance nonvolatile semiconductor memory device according to Embodiment 2 of the present invention.

FIG. 6A is a cross-sectional view showing an example of a configuration of a variable resistance nonvolatile semiconductor memory device 200a according to Embodiment 2 of the present invention.

As shown in FIG. 6A, the variable resistance nonvolatile semiconductor memory device 200a in Embodiment 2 includes (1) a substrate 201 and (2) a variable resistance element 208 which includes a lower electrode layer 202, an upper electrode layer 204, and a variable resistance layer 203 that is positioned between the two electrodes.

The lower electrode layer 202 includes at least (1) a first conductive layer 202a and (2) a second conductive layer 202c which is formed on the first conductive layer 202a, is in contact with the variable resistance layer 203, and is for stabilizing the interface between the lower electrode layer 202 and the variable resistance layer 203. Note that, the drawing shows that the first conductive layer 202a includes an oxidatively degraded layer 202b which is formed on an upper surface of the first conductive layer 202a due to oxidization of the first conductive layer 202a. The first conductive layer 202a is provided on the substrate 201, and the second conductive layer 202c is in contact with the variable resistance layer 203. The oxidatively degraded layer 202b is the upper surface of the first conductive layer 202a, namely, is formed in the first conductive layer 202a near the interface between the first conductive layer 202a and the second conductive layer 202c. Here, the first conductive layer 202a and the second conductive layer 202c may comprise the same material but need not necessarily comprise the same material. It should be noted that, as described later, the second conductive layer 202c and the variable resistance layer 203 are continuously formed in one apparatus without being exposed to the atmosphere.

Here, the lower electrode layer 202 comprises a tantalum nitride, titanium nitride, or the like. Here, the case in which the first conductive layer 202a comprising a titanium nitride or the like is deposited with a CVD process is described. An oxygen-deficient tantalum oxide that is the variable resistance layer 203 is formed after the above process using a sputtering method. Thus, irrespective of whether a planarization process is necessary or not, the lower electrode layer 202 is basically exposed to the atmosphere. As a result, on the surface of the first conductive layer 202a, the oxidatively degraded layer 202b which is produced due to oxidation of the surface (upper surface) of the first conductive layer 202a is formed.

The variable resistance layer 203 included in the variable resistance element 208 comprises an oxygen-deficient metal oxide, such as an oxygen-deficient tantalum oxide.

Figure 6B:
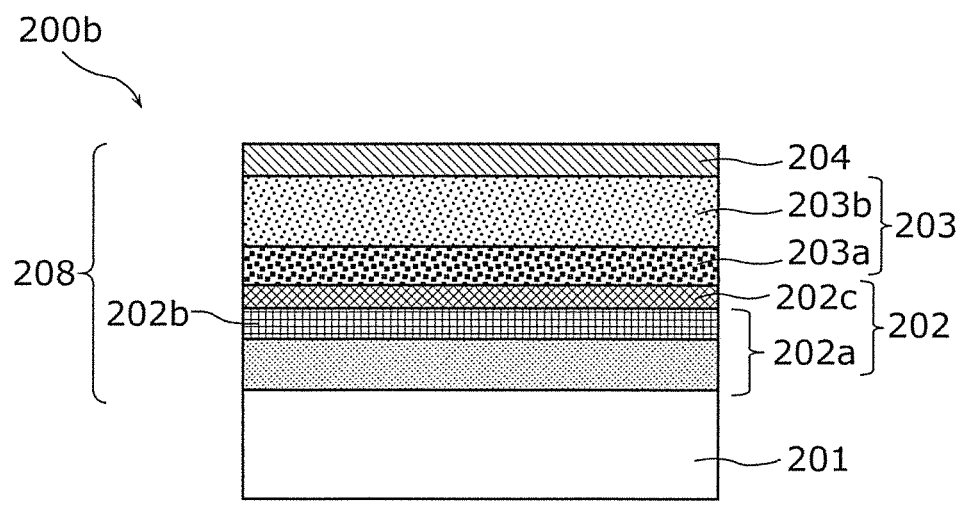
[FIG. 6B] is a cross-sectional view showing a second configuration example of the variable resistance nonvolatile semiconductor memory device according to Embodiment 2 of the present invention.

Note that, FIG. 6B shows a nonvolatile semiconductor memory device 200b as another configuration of the nonvolatile semiconductor memory device which includes the oxidatively degraded layer 202b. As shown, the variable resistance layer 203 may include two layers, namely, a high-concentration-oxygen containing layer (a second variable resistance layer 203b) and a low-concentration-oxygen containing layer (a first variable resistance layer 203a), and the high-concentration-oxygen containing layer (the second variable resistance layer 203b) may be positioned on the side connected to the upper electrode layer 204. In other words, the variable resistance layer 203 may include the first variable resistance layer 203a and the second variable resistance layer 203b which are metal oxides having a different degree of oxygen deficiency. PTL 3 describes in detail the embodiment in which the variable resistance layer has two layers that are stacked. In this embodiment, the oxygen content atomic percentage of the first variable resistance layer (low-concentration-oxygen containing layer) 203a is in the range of 44.4 to 65.5 atm %, and the oxygen content atomic percentage of the second variable resistance layer (high-concentration-oxygen containing layer) 203b is in the range of 67.7 to 71.4 atm %. This is to facilitate the occurrence of a resistance change due to oxidation and reduction at the interface of the upper electrode layer, by designing the oxygen content atomic percentage to be high in the vicinity of the upper electrode layer 204. With this, good memory cell characteristics that enable low voltage driving can be obtained.

The upper electrode layer 204 included in the variable resistance element 208 comprises platinum, iridium, or the like.

A method of manufacturing the nonvolatile semiconductor memory device 200a according to this embodiment is substantially the same as the method of manufacturing the nonvolatile semiconductor memory device 100a according to Embodiment 1. Note that, in this embodiment, the process in which the oxidatively degraded layer 202b is formed on the first conductive layer 202a is specifically described. The following describes a difference between this embodiment and Embodiment 1 (formation of the oxidatively degraded layer 202b).

As the first conductive layer 202a, a titanium nitride thin-film is formed using a CVD method. Titanium chloride is used as a source, and ammonia is used as reactive gas. The CVD process is generally superior in coverage characteristics and filling characteristics compared to the sputtering method, and thus is suitable for deposition of the first conductive layer 202a. An oxygen-deficient tantalum oxide is formed by sputtering as the variable resistance layer 203 as with Embodiment 1. At this time, the first conductive layer 202a formed with the CVD process is once taken out of the deposition apparatus, and thus is exposed to the atmosphere. As a result, the first conductive layer 202a is naturally oxidized, and thus the oxidatively degraded layer 202b is formed on the surface (upper surface) of the first conductive layer 202a. From the SIMS results shown in FIG. 3A, it is observed that the surface of the first conductive layer 202a has greater oxygen content due to the natural oxidization compared to the sputtering process in which the oxygen gas is introduced. In view of this, the second conductive layer 202c and the variable resistance layer 203 are continuously deposited on the oxidatively degraded layer 202b in one apparatus without exposure to the atmosphere. A tantalum nitride thin-film is formed as the second conductive layer 202c. Such a tantalum nitride thin film may be produced in a nitrogen gas atmosphere using a Ta target, for example, at a room temperature condition, with the pressure of a chamber in the range of 0.03 Pa to 3 Pa, and the Ar/N$_2$ flow rate in the range of 20 sccm/5 sccm to 20 sccm/30 sccm. As the variable resistance layer 203, a TaO$_x$ film is deposited on the second conductive layer 202c using a reactive sputtering method. Such a TaO$_x$ film may be produced in an oxygen gas atmosphere using a Ta target, for example, at a room temperature condition, with the pressure of a chamber in the range of 0.03 Pa to 3 Pa, and the Ar/O$_2$ flow rate in the range of 20 sccm/5 sccm to 20 sccm/30 sccm. Note that, the method for depositing these films is not limited to the sputtering method, but a CVD method or an ALD method may be used. Since the second conductive layer 202c and the variable resistance layer 203 are continuously formed, the variable resistance layer 203 and the oxidatively degraded layer 202b do not contact each other. Thus, it is possible to inhibit the oxidatively degraded layer 202b from being a parasitic resistance component. As a result, a current value of the variable resistance element 208 in a low resistance state increases, enlarging the window of operation. With this, the operation of the nonvolatile semiconductor memory device 200a becomes stable, and endurance on repeated writing also improves.

Lastly, the upper electrode layer 204 comprising platinum or iridium is formed using a DC sputtering method. The iridium film may be produced using an iridium target, for example, at a room temperature condition, with the pressure of a chamber in the range of 0.03 Pa to 3 Pa, and argon flow rate in the range of 20 sccm to 100 sccm.

The nonvolatile semiconductor memory device in this embodiment includes the oxidatively degraded layer 202b in the lower electrode layer 202, and the second conductive layer 202c that is in contact with the variable resistance layer 203 is formed on the upper surface of the oxidatively degraded layer 202b. As a result, effects from parasitic resistance originating from the oxidatively degraded layer 202b at the interface between the lower electrode layer 202 and the variable resistance layer 203 are removed.

Note that, although the nonvolatile semiconductor memory device in this embodiment includes the first conductive layer 202a comprising a TiN and the second conductive layer 202c comprising TaN, the materials are not limited to such examples. Furthermore, it is apparent that similar advantageous effects can be obtained even when the first conductive layer 202a and the second conductive layer 202c comprise different materials. In addition, it is apparent that similar advantageous effects can be obtained even when a planarization process (a process of planarizing the upper surface of the first conductive layer 202a) with a CMP process or the like is added on the first conductive layer 202a.

Furthermore, as with Embodiment 1, the following is applicable to this embodiment regarding the oxygen content in the vicinity of the interface between the variable resistance layer 203 and the second conductive layer 202c. Specifically, as FIG. 3B indicates, in the nonvolatile semiconductor memory devices 200a and 200b, the oxygen content in the vicinity of the interface between the variable resistance layer 203 and the second conductive layer 202c is smaller than the oxygen content in the vicinity of the interface (i.e., the oxidatively degraded layer 202b) between the second conductive layer 202c and the first conductive layer 202a.

(Embodiment 3)

Next, a variable resistance nonvolatile semiconductor memory device according to Embodiment 3 of the present invention is described. The nonvolatile semiconductor memory device according to this embodiment has a structure in which a non-ohmic element is stacked on the variable resistance element according to Embodiment 1.

Figure 7A:
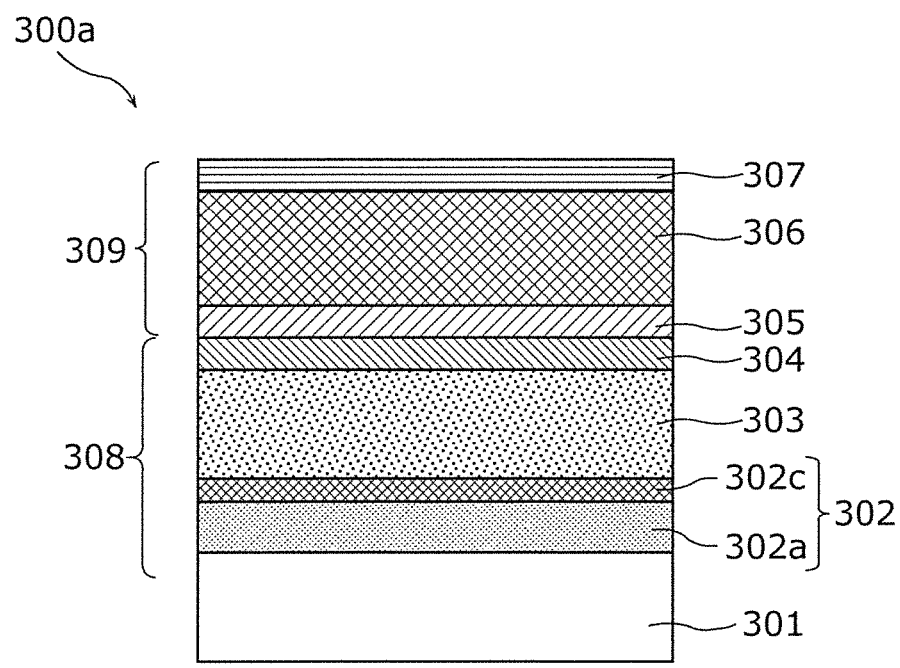
[FIG. 7A] is a cross-sectional view showing a first configuration example of a variable resistance nonvolatile semiconductor memory device according to Embodiment 3 of the present invention.

FIG. 7A is a cross-sectional view showing an example of a configuration of a variable resistance nonvolatile semiconductor memory device 300a according to Embodiment 3 of the present invention.

As shown in FIG. 7A, the variable resistance nonvolatile semiconductor memory device 300a according to Embodiment 3 includes (1) a substrate 301, (2) a variable resistance element 308 which includes a lower electrode layer 302, an upper electrode layer 304, and a variable resistance layer 303 that is positioned between the two electrodes, and (3) a non-ohmic element 309 which includes a first electrode layer 305, a semiconductor layer 306, and a second electrode layer 307 and functions as a current steering element (bidirectional diode). The lower electrode layer 302 includes at least (1) a first conductive layer 302a and (2) a second conductive layer 302c which is formed on the first conductive layer 302a, is in contact with the variable resistance layer 303, and is for stabilizing the interface between the lower electrode layer 302 and the variable resistance layer 303. Note that, in this embodiment, although the first conductive layer 302a includes an oxidatively degraded layer which is formed on the upper surface of the first conductive layer 302a due to oxidization of the first conductive layer 302a, the illustration is omitted in the drawing, as with Embodiment 1. Here, the first conductive layer 302a and the second conductive layer 302c may comprise the same material but need not necessarily comprise the same material. It should be noted that, the second conductive layer 302c and the variable resistance layer 303 are continuously formed in one apparatus without being exposed to the atmosphere.

This embodiment is different from Embodiment 1, in that the non-ohmic element 309 is stacked on the variable resistance element 308. The following describes manufacturing of the non-ohmic element.

The first electrode layer 305 comprising tantalum nitride is formed on the upper electrode layer 304. The tantalum nitride film is deposited using, for example, a technique what is called reactive sputtering, that is, a metal tantalum target is sputtered in an atmosphere of mixed gas of argon and nitrogen. Then, typical deposition conditions are pressure in the range of 0.08 Pa to 2 Pa, a substrate temperature in the range of 20 degrees Celsius to 300 degrees Celsius, flow ratio of nitrogen gas (a ratio of nitrogen flow to the total flow of argon and nitrogen) in the range of 2% to 50%, and a DC power in the range of 100 W to 1300 W. Under these conditions, a deposition time is adjusted so that the thickness of the tantalum nitride film is 20 nm to 100 nm.

Subsequently, a nitrogen-deficient silicon nitride film is formed as the semiconductor layer 306, and a tantalum nitride is formed as the second electrode layer 307. Here, nitrogen-deficient silicon nitride film is a silicon nitride film containing smaller amount of nitrogen compared to the silicon nitride film ($Si_3N_4$) having a stoichiometric composition.

The nitrogen-deficient silicon nitride film is deposited using, for example, a technique what is called reactive sputtering, that is, a polycrystalline silicon target is sputtered in an atmosphere of mixed gas of argon and nitrogen. Then, typical deposition conditions are pressure in the range of 0.08 Pa to 2 Pa, a substrate temperature in the range of 20 degrees Celsius to 300 degrees Celsius, flow ratio of nitrogen gas (a ratio of nitrogen flow to the total flow of argon and nitrogen) in the range of 2% to 50%, and a DC power in the range of 100 W to 1300 W. Under these conditions, a deposition time is adjusted so that the thickness of the silicon nitride film is 5 nm to 20 nm.

Here, work function of the tantalum nitride is 4.6 eV that is adequately higher than a silicon electron affinity of 3.8 eV. Thus, a Schottky barrier is formed at the interface between the semiconductor layer 306 and the second electrode layer 307. In this configuration, each of the second electrode layer 307 and the first electrode layer 305 comprises tantalum nitride and thus the non-ohmic element 309 functions as a bidirectional MSM diode.

Figure 7B:
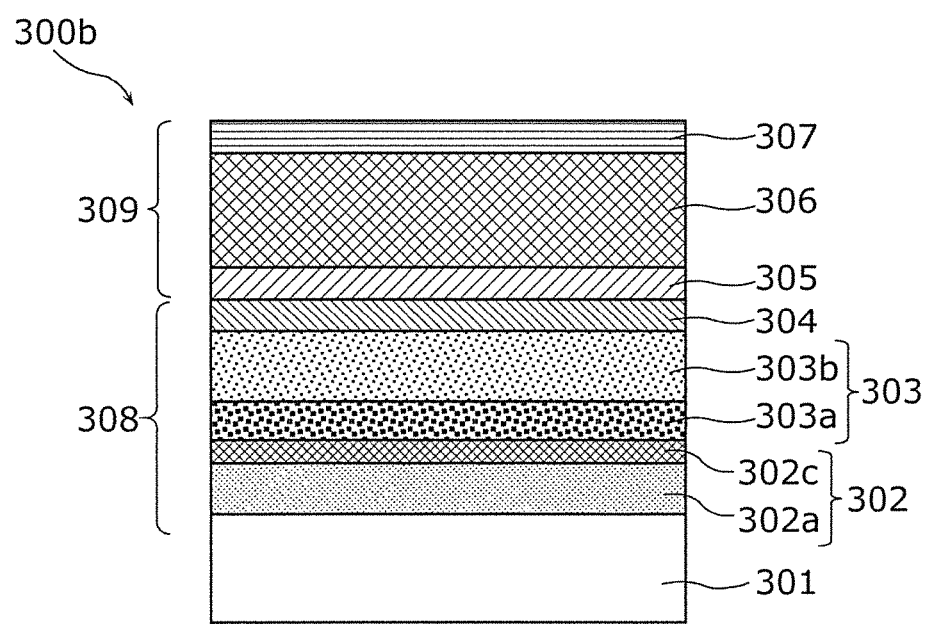
[FIG. 7B] is a cross-sectional view showing a second configuration example of the variable resistance nonvolatile semiconductor memory device according to Embodiment 3 of the present invention.

Note that, FIG. 7B shows a nonvolatile semiconductor memory device 300b as another configuration of the nonvolatile semiconductor memory device which includes a non-ohmic element. As shown, the variable resistance layer 303 may include two layers, namely, a high-concentration-oxygen containing layer (a second variable resistance layer 303b) and a low-concentration-oxygen containing layer (a first variable resistance layer 303a), and the high-concentration-oxygen containing layer (the second variable resistance layer 303b) may be positioned on the side connected to the upper electrode layer 304. In other words, the variable resistance layer 303 may include the first variable resistance layer 303a and the second variable resistance layer 303b which are metal oxides having a different degree of oxygen deficiency.

Furthermore, the non-ohmic element 309 is not limited to the bidirectional MSM diode, but may be a bidirectional MIM diode (a diode including two electrode layers and an insulating layer positioned between the two electrode layers).

As described, in each of the nonvolatile semiconductor memory devices 300a and 300b according to this embodiment, the second conductive layer 302c is formed at the position where the lower electrode layer 302 is in contact with the variable resistance layer 303. Thus, even when the oxidatively degraded layer is formed on the first conductive layer 302a, the effect from the parasitic resistance component originating from the oxidatively degraded layer is reduced, and a decrease in a voltage other than in the variable resistance element 308 is prevented. As a result, a value of current which flows in the variable resistance element 308 increases when the variable resistance layer 303 is in a low resistance state. Thus, the window of operation is enlarged and operation is stabilized.

(Embodiment 4)

Next, a variable resistance nonvolatile semiconductor memory device according to Embodiment 4 of the present invention is described. The nonvolatile semiconductor memory device according to this embodiment has a structure in which a non-ohmic element is stacked on the variable resistance element according to Embodiment 2.

Figure 8A:
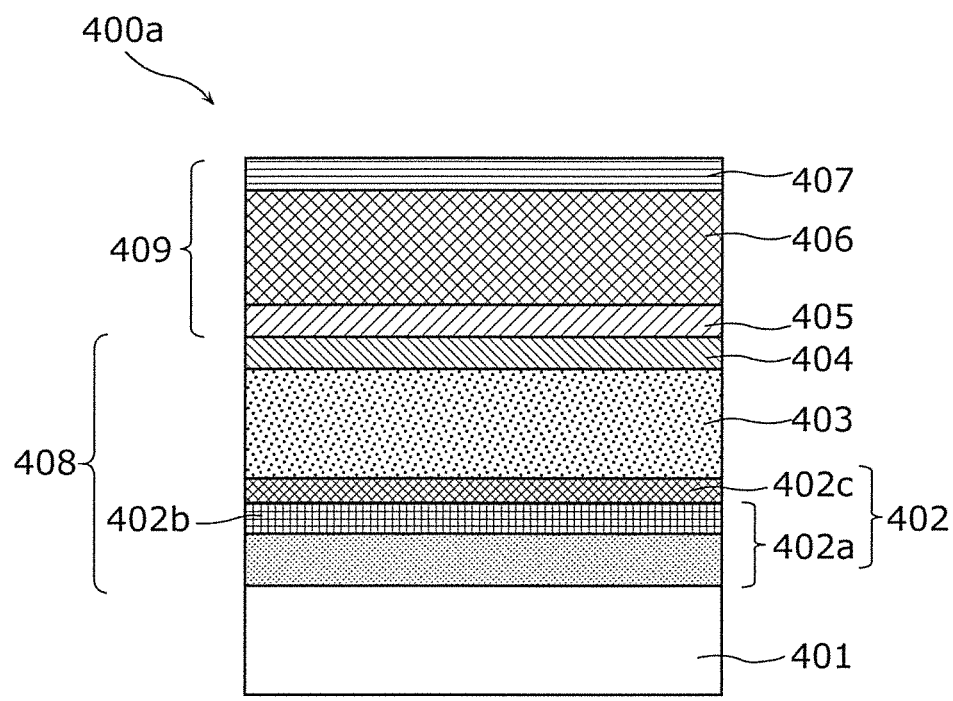
[FIG. 8A] is a cross-sectional view showing a first configuration example of a variable resistance nonvolatile semiconductor memory device according to Embodiment 4 of the present invention.

FIG. 8A is a cross-sectional view showing an example of a configuration of a variable resistance nonvolatile semiconductor memory device 400a according to Embodiment 4 of the present invention.

As shown in FIG. 8A, the variable resistance nonvolatile semiconductor memory device 400a according to Embodiment 4 includes (1) a substrate 401, (2) a variable resistance element 408 which includes a lower electrode layer 402, an upper electrode layer 404, and a variable resistance layer 403 that is positioned between the two electrodes, and (3) a non-ohmic element 409 which includes a first electrode layer 405, a semiconductor layer 406, and a second electrode layer 407 and functions as a current steering element (bidirectional diode). The lower electrode layer 402 includes at least (1) a first conductive layer 402a and (2) a second conductive layer 402c which is formed on the first conductive layer 402a, is in contact with the variable resistance layer 403, and is for stabilizing the interface between the lower electrode layer 402 and the variable resistance layer 403. Note that, the drawing shows that the first conductive layer 402a includes an oxidatively degraded layer 402b which is formed on the upper surface of the first conductive layer 402a due to oxidization of the first conductive layer 402a. Here, the first conductive layer 402a and the second conductive layer 402c may comprise the same material but need not necessarily comprise the same material. It should be noted that, the second conductive layer 402c and the variable resistance layer 403 are continuously formed without being exposed to the atmosphere.

This embodiment is different from Embodiment 2, in that the non-ohmic element 409 is stacked on the variable resistance element 408. The following describes manufacturing of the non-ohmic element.

The first electrode layer 405 comprising tantalum nitride is formed on the upper electrode layer 404. The tantalum nitride film is deposited using, for example, a technique what is called reactive sputtering, that is, a metal tantalum target is sputtered in an atmosphere of mixed gas of argon and nitrogen. Then, typical deposition conditions are pressure in the range of 0.08 Pa to 2 Pa, a substrate temperature in the range of 20 degrees Celsius to 300 degrees Celsius, flow ratio of nitrogen gas (a ratio of nitrogen flow to the total flow of argon and nitrogen) in the range of 20% to 40%, and a DC power in the range of 100 W to 1300 W. Under these conditions, a deposition time is adjusted so that the thickness of the tantalum nitride film is 20 nm to 100 nm.

Subsequently, a nitrogen-deficient silicon nitride film is formed as the semiconductor layer 406, and a tantalum nitride is formed as the second electrode layer 407.

The nitrogen-deficient silicon nitride film is deposited using, for example, a technique what is called reactive sputtering, that is, a polycrystalline silicon target is sputtered in an atmosphere of mixed gas of argon and nitrogen. Then, typical deposition conditions are pressure in the range of 0.08 Pa to 2 Pa, a substrate temperature in the range of 20 degrees Celsius to 300 degrees Celsius, flow ratio of nitrogen gas (a ratio of nitrogen flow to the total flow of argon and nitrogen) in the range of 2% to 50%, and a DC power in the range of 100 W to 1300 W. Under these conditions, a deposition time is adjusted so that the thickness of the silicon nitride film is 5 nm to 20 nm.

Here, work function of the tantalum nitride is 4.6 eV that is adequately higher than a silicon electron affinity of 3.8 eV. Thus, a Schottky barrier is formed at the interface between the semiconductor layer 406 and the second electrode layer 407. In this configuration, each of the second electrode layer 407 and the first electrode layer 405 comprises tantalum nitride and thus the non-ohmic element 409 functions as a bidirectional MSM diode.

Figure 8B:
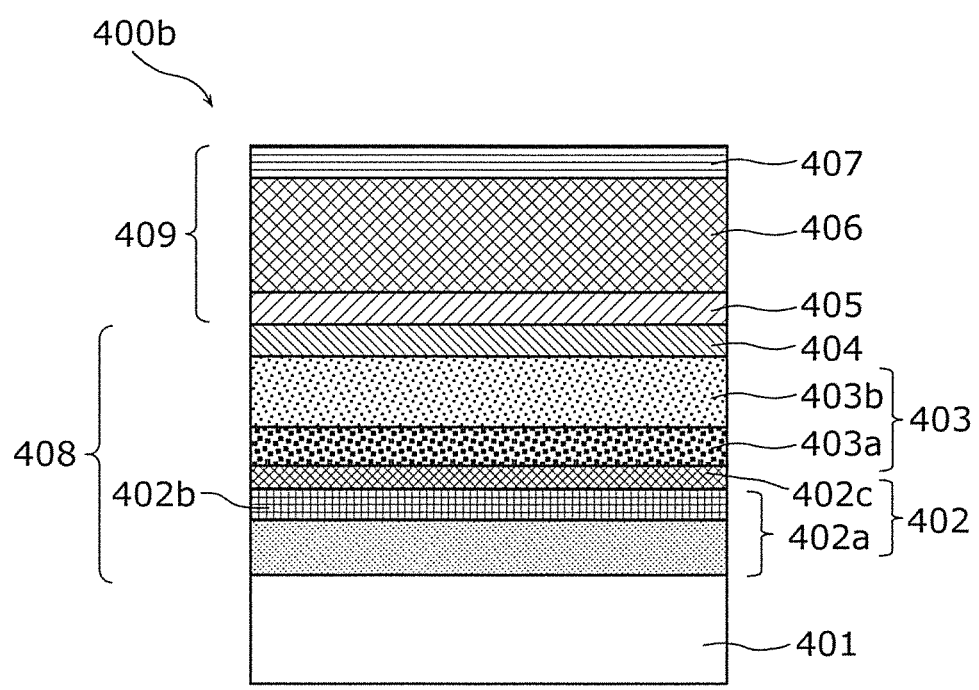
[FIG. 8B] is a cross-sectional view showing a second configuration example of the variable resistance nonvolatile semiconductor memory device according to Embodiment 4 of the present invention.

Note that, FIG. 8B shows a nonvolatile semiconductor memory device 400b as another configuration of the nonvolatile semiconductor memory device which includes a non-ohmic element. As shown, the variable resistance layer 403 may include two layers, namely, a high-concentration-oxygen containing layer (a second variable resistance layer 403b) and a low-concentration-oxygen containing layer (a first variable resistance layer 403a), and the high-concentration-oxygen containing layer (the second variable resistance layer 403b) may be positioned on the side connected to the upper electrode layer 404. In other words, the variable resistance layer 403 may include the first variable resistance layer 403a and the second variable resistance layer 403b which are metal oxides having a different degree of oxygen deficiency.

Furthermore, the non-ohmic element 409 is not limited to the bidirectional MSM diode, but may be a bidirectional MIM diode (a diode including two electrode layers and an insulating layer positioned between the two electrode layers).

As described, in each of the nonvolatile semiconductor memory devices 400a and 400b according to this embodiment, the second conductive layer 402c is formed at the position where the lower electrode layer 402 is in contact with the variable resistance layer 403. With this, the effect from the parasitic resistance component originating from the oxidatively degraded layer 402b on the first conductive layer 402a is reduced, and a decrease in a voltage other than in the variable resistance element 408 is prevented. As a result, a value of current which flows in the variable resistance element 408 increases when the variable resistance layer 403 is in a low resistance state. Thus, the window of operation is enlarged and operation is stabilized.

(Embodiment 5)

Next, a variable resistance nonvolatile semiconductor memory device according to Embodiment 5 of the present invention is described. The nonvolatile semiconductor memory device according to this embodiment has a configuration in which the nonvolatile semiconductor memory devices according to Embodiment 2 are arranged in an array.

Figure 9:
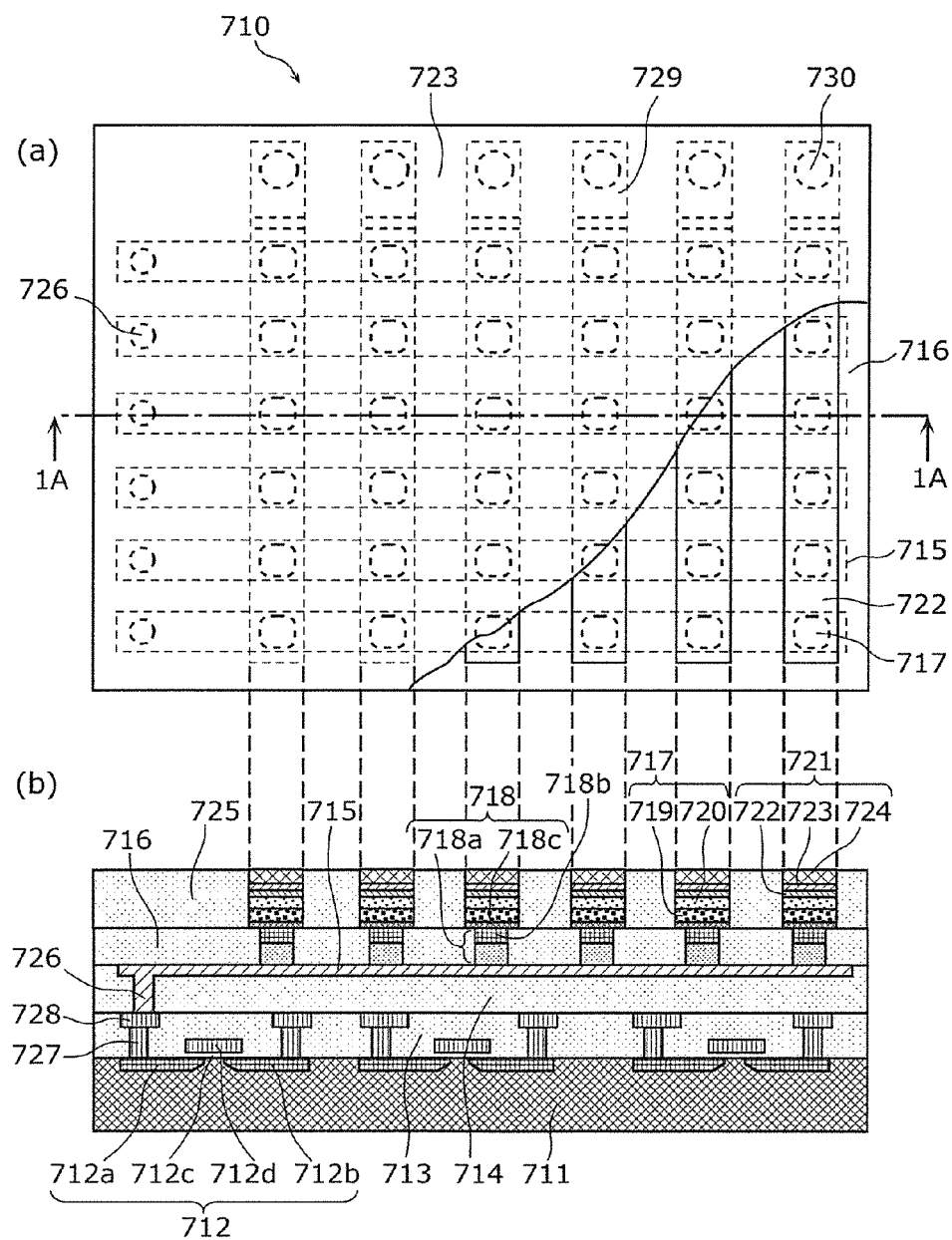
[FIG. 9] (a) in FIG. 9 is a plan view which describes a configuration of a nonvolatile semiconductor memory device according to Embodiment 5 of the present invention. (b) in FIG. 9 is a cross-sectional view as viewed from the direction of the arrow along the line 1A-1A in (a) in FIG. 9
Figure 10:
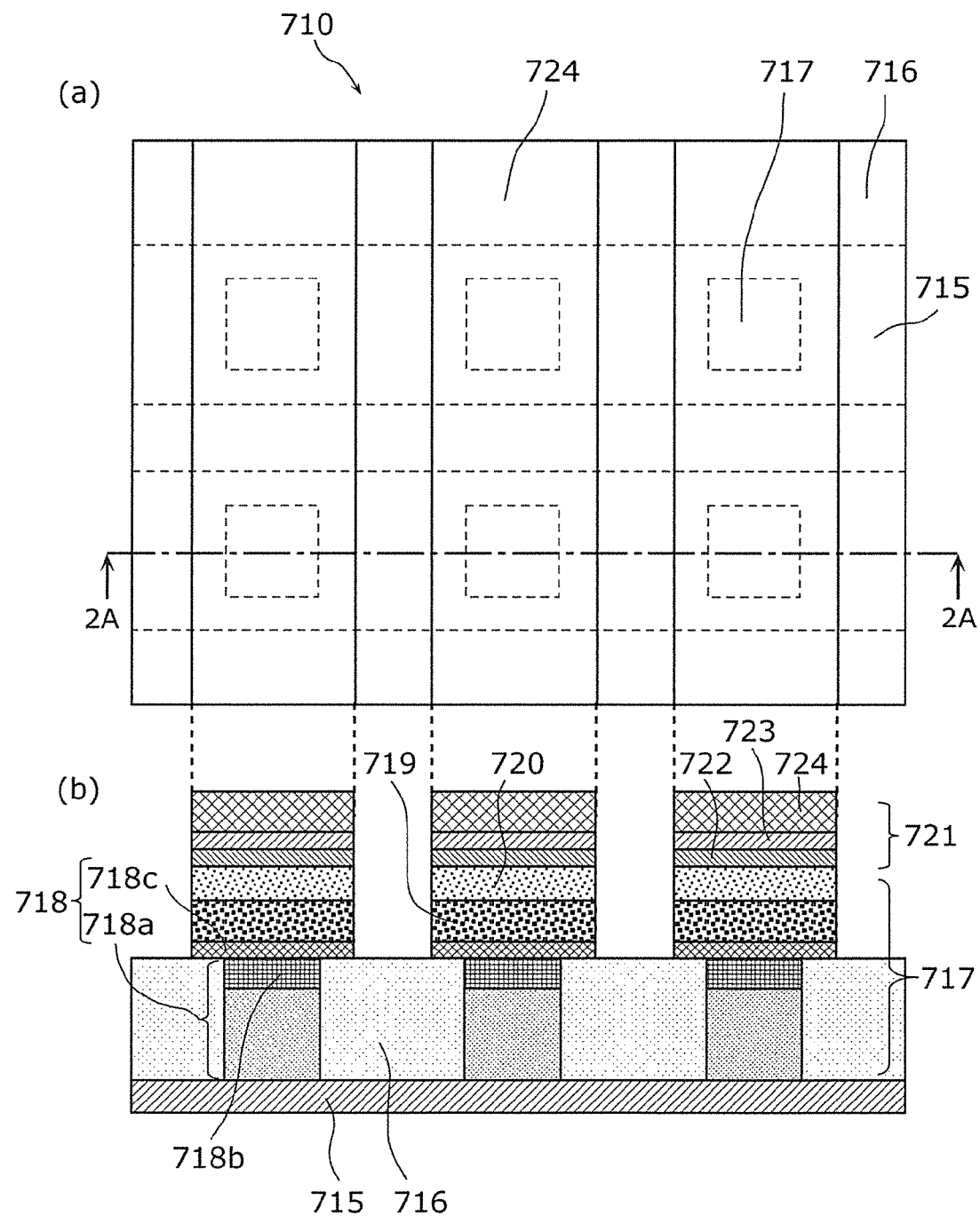
[FIG. 10] (a) in FIG. 10 is a plan view of a partial magnified view of main parts for showing a configuration of a variable resistance element and a non-ohmic element of a nonvolatile semiconductor memory device according to Embodiment 5. (b) in FIG. 10 is a cross-sectional view as viewed from the direction of the arrow along the line 2A-2A in (a) in FIG. 10.

FIG. 9 is a diagram which describes a configuration of a nonvolatile semiconductor memory device 710 according to Embodiment 5 of the present invention, and its plan view is shown in (a) in FIG. 9. Shown in (b) in FIG. 9 is a cross-sectional view as viewed from the direction of the arrow along the line 1A-1A in (a) in FIG. 9. Note that, in the plan view shown in (a) in FIG. 9, an insulating protection film that is the uppermost layer is partially cut out for ease of comprehension. Furthermore, the illustration of the insulating protection film that is the uppermost layer is also omitted in the cross-sectional view shown in (b) in FIG. 9. Furthermore, FIG. 10 is a partial magnified view of main parts for describing a configuration of a variable resistance element 717 and a non-ohmic element 721, and their plan view is shown in (a) in FIG. 10. Shown in (b) in FIG. 10 is a cross-sectional view as viewed from the direction of the arrow along the line 2A-2A in (a) in FIG. 10.

The nonvolatile semiconductor memory device 710 according to this embodiment includes: a substrate 711; lower electrode lines 715 which are formed on the substrate 711 and are in a stripe pattern (a plurality of lower electrode lines each of which is rectangular in shape arranged at a predetermined interval); an interlayer insulating layer 716 which is provided on the substrate 711 including the lower electrode lines 715 and in which contact holes are formed at positions facing the lower electrode lines 715; a lower electrode layer 718 (a first conductive layer 718a, an oxidatively degraded layer 718b, and a second conductive layer 718c) which is embedded in each of the contact holes and is connected to a corresponding one of the lower electrode lines 715; the variable resistance element 717 formed on the lower electrode layer 718; and the non-ohmic element 721 formed on the variable resistance element 717.

In addition, the non-ohmic element 721 in this embodiment includes a first electrode layer 722 and a second electrode layer 724 which are metal electrode assembly layers, and an insulating layer 723 positioned between the two metal electrode assembly layers, and thus is an MIM diode having a stacked structure of three layers.

Furthermore, in this embodiment, the insulating layers 723 and the second electrode layers 724 are formed above the interlayer insulating layer and are formed in a stripe pattern that cross the lower electrode lines 715. The second electrode layer 724 makes up a part of an upper layer electrode line. In addition, a variable resistance layer 719, the lower electrode layer 718 connected to the variable resistance layer 719, and an upper electrode layer 720 are included in the variable resistance element 717. Each of the lower electrode layers 718 is connected to a corresponding one of the lower electrode lines 715. As the variable resistance layer 719, an oxygen-deficient tantalum oxide, such as $TaO_x$ ($0<x<2.5$) is preferable in terms of stability of the variable resistance characteristics and reproducibility for manufacturing. An oxygen-deficient $TaO_x$ can be produced using a reactive sputtering method, for example. At this time, the oxygen content atomic percentage of the variable resistance layer 719 can be controlled by adjusting the flow rate of oxygen in the sputtering gas. Note that, as shown in FIG. 9, the insulating layer 723 and the second electrode layer 724 extend to an outside of a region in which the variable resistance elements 717 and the non-ohmic elements 721 are arranged in a matrix, and the second electrode layer 724 is connected to a corresponding one of upper layer electrode lines 729 outside the matrix region. Furthermore, in the matrix region, the second electrode layer 724 also functions as an upper layer electrode line.

Furthermore, in this embodiment, a silicon single crystal substrate is used as the substrate 711. A semiconductor circuit in which active elements 712, such as a transistor, are integrated is formed on the substrate 711. Note that, although FIG. 9 shows, as the active elements 712, transistors each of which includes a source region 712a, a drain region 712b, a gate insulating film 712c, and a gate electrode 712d, the nonvolatile semiconductor memory device 710 in this embodiment includes not only these active elements 712 but also other elements, such as a DRAM, which are generally necessary for a memory circuit.

Each of the lower electrode lines 715 and the upper layer electrode lines 729 is connected to a corresponding one of the active elements 712 in a region different from the matrix region in which the variable resistance element 717 and the non-ohmic element 721 are formed. Specifically, in FIG. 9, the lower electrode lines 715 are connected to a source region 712a of the active element 712 via embedded conductors 726 and 727 and an electrode line 728. Note that, likewise, the upper layer electrode lines 729 are also connected to a different active element (not shown) via the embedded conductor 730.

The lower electrode line 715 can be easily formed, for example, by depositing a film through sputtering using a Ti—Al—N alloy, Cu, or Al, and performing an exposure process and an etching process on the film. Furthermore, the variable resistance layer 719 included in the variable resistance element 717 is not limited to the above-described tantalum oxide, but may be formed, for example, by sputtering using a metal oxide, such as a titanium oxide, a vanadium oxide, a cobalt oxide, a nickel oxide, a zinc oxide, or a niobium oxide film. Such a metal oxide material exhibits a specific resistance value when a voltage or a current equal to or larger than a threshold is applied, and maintains the specific resistance value until a pulse voltage or a pulse current having a certain value is newly applied.

Furthermore, an insulating oxide material can be used as the interlayer insulating layer 716. Specifically, a silicon oxide (SiO) formed by the CVD method, a TEOS-SiO film formed by the CVD method using ozone ($O_3$) and tetraethoxysilane (TEOS), a silicon nitride (SiN) film, or the like may be used. Furthermore, for example, a silicon carbon nitride (SiCN) film, a silicon oxycarbide (SiOC) film, or a fluorinated silicon oxide (SiOF) film which are low-permittivity materials may be used.

Next, as the non-ohmic element 721, an MIM diode having a stacked structure can be used in which, for example, (i) tantalum (Ta), aluminum (Al), or a combination thereof used as the second electrode layer 724 and (ii) a silicon nitride (SiN) used as the insulating layer 723 are stacked. Note that, an electrode is not limited to Al, but Ti or Cr can also be used. However, use of Ti or Cr increases line resistance, and thus it is preferable that a thin-film comprising Al, Cu, or the like be additionally formed and stacked. It is preferable that the first electrode layer 722 comprise a metal nitride comprising a metal comprised in the variable resistance layer 719. For example, in this embodiment, it is preferable that a tantalum nitride that is a nitride of tantalum comprised in the variable resistance layer 719 be the first electrode layer 722.

Figure 11:
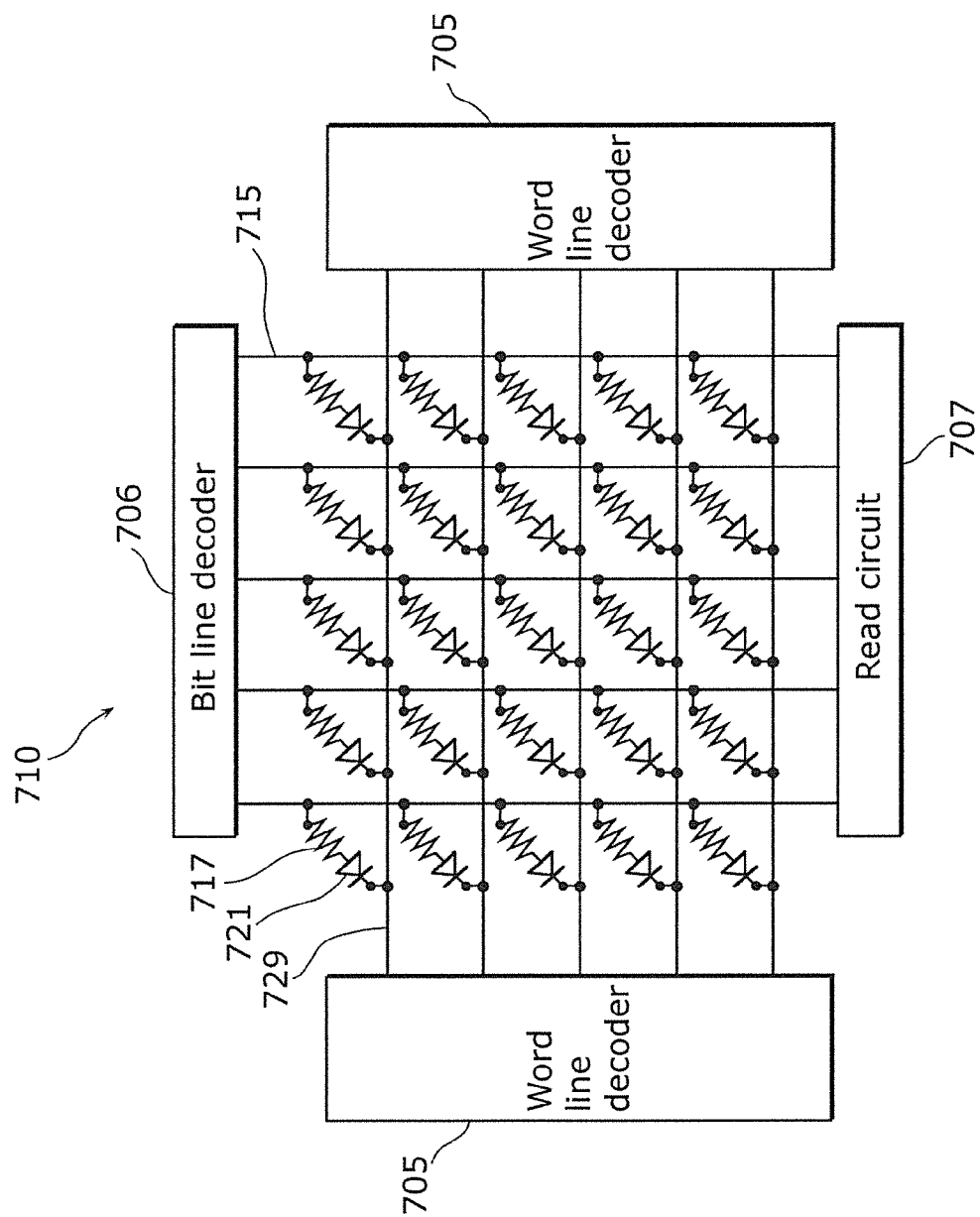
[FIG. 11] is a block diagram which describes an outline of a circuit configuration of the nonvolatile semiconductor memory device according to Embodiment 5.

FIG. 11 is a block diagram which describes an outline of a circuit configuration of the nonvolatile semiconductor memory device 710 according to this embodiment. As shown in FIG. 11, the variable resistance element 717 and the non-ohmic element 721 are connected in series configuring a memory cell, one end of the variable resistance element 717 is connected to one of the lower electrode lines 715, and one end of the non-ohmic element 721 is connected to a corresponding one of the upper layer electrode lines 729. The non-ohmic element 721 includes the aforementioned MSM diode or the MIM diode. Each of the lower electrode lines 715 is connected to a bit line decoder 706 and a read circuit 707. Furthermore, each of the upper layer electrode lines 729 is connected to word line decoders 705. As described, the lower electrode lines 715 function as bit lines and the upper layer electrode lines 729 function as word lines, which are arranged in a matrix. In addition, the bit line decoder 706, the word line decoder 705, and the read circuit 707 configure a peripheral circuit. Such a peripheral circuit includes the active element 712 which includes, for example, a MOSFET.

In the nonvolatile semiconductor memory device 710, when writing is performed, the word line decoder 705 selects one of the word lines and applies a write voltage to the selected word line, and the bit line decoder 706 selects one of the bit lines and applies a write voltage to the selected bit line. As a result, the variable resistance element 717 included in the memory cell located at a cross-point of the selected word line and the selected bit line takes a high resistance state or a low resistance state according to the applied voltage.

On the other hand, when reading is performed, the word line decoder 705 selects one of the word lines and applies a read voltage to the selected word line, and the bit line decoder 706 selects one of the bit lines and applies a read voltage to the selected bit line. As a result, a current flows in the variable resistance element 717 included in the memory cell located at a cross-point of the selected word line and the selected bit line, according to a resistance state. The current is detected by the read circuit 707. Thus, the resistance state (high resistance state/low resistance state) of the variable resistance element 717 included in the selected memory cell is determined according to the current detected by the read circuit 707.

Next, a method of manufacturing the nonvolatile semiconductor memory device 710 according to this embodiment is described with reference to FIG. 12A to FIG. 12G.

Figure 12A:
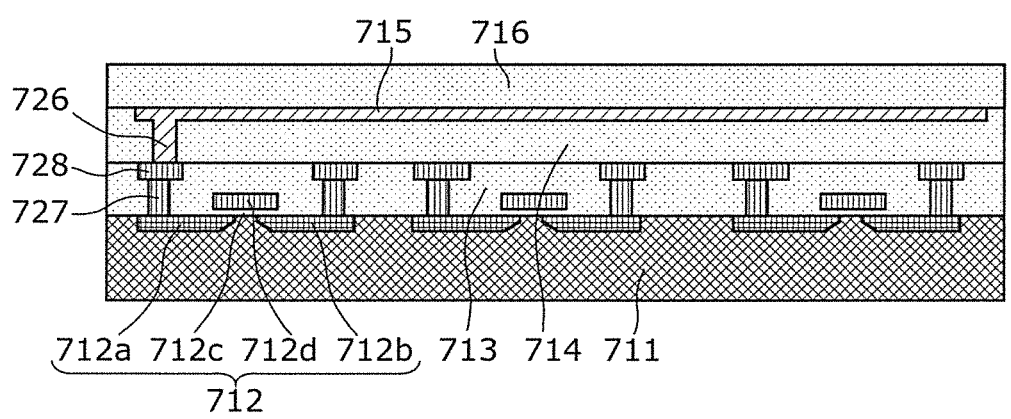
[FIG. 12A] is a diagram showing, in a method of manufacturing the nonvolatile semiconductor memory device according to Embodiment 5, a process up to a formation of the interlayer insulating layer above the substrate on which the active element is formed.
Figure 12B:
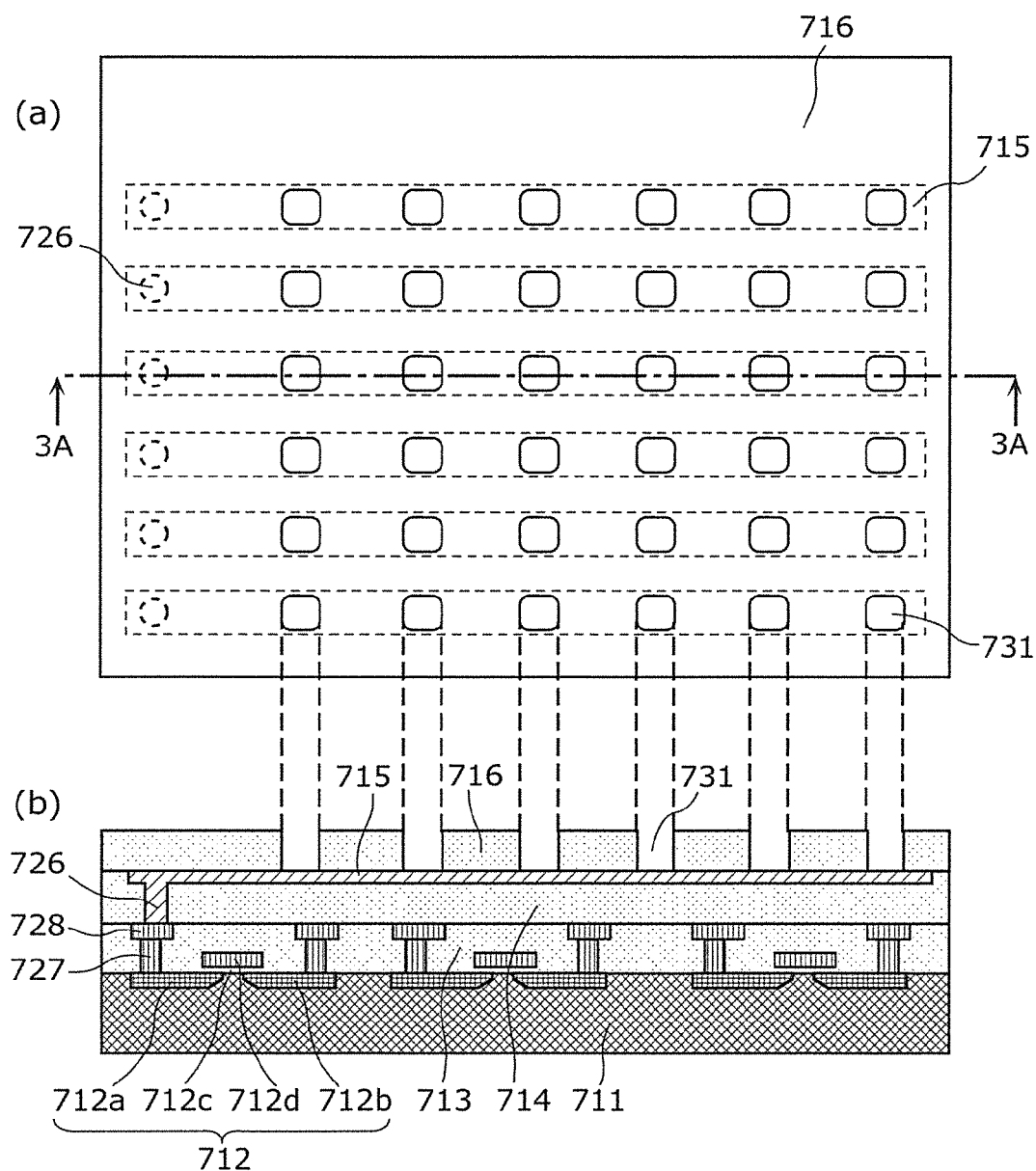
[FIG. 12B] (a) in FIG. 12B is a plan view showing, in the method of manufacturing the nonvolatile semiconductor memory device according to Embodiment 5, a state in which contact holes are formed. (b) in FIG. 12B is a cross-sectional view as viewed from the direction of the arrow along the line 3A-3A in (a) in FIG. 12B.

FIG. 12A is a diagram showing a process of forming the interlayer insulating layer 716 above the substrate 711 on which the active element 712 is formed. (a) in FIG. 12B is a plan view showing a state in which a contact hole 731 is formed in the interlayer insulating layer 716. (b) in FIG. 12B is a cross-sectional view as viewed from the direction of the arrow along the line 3A-3A in (a) in FIG. 12B. Note that, each of the cross-sectional views in the following, including (a) in FIG. 12B, shows a cross section taken along the same portion.

Figure 12C:
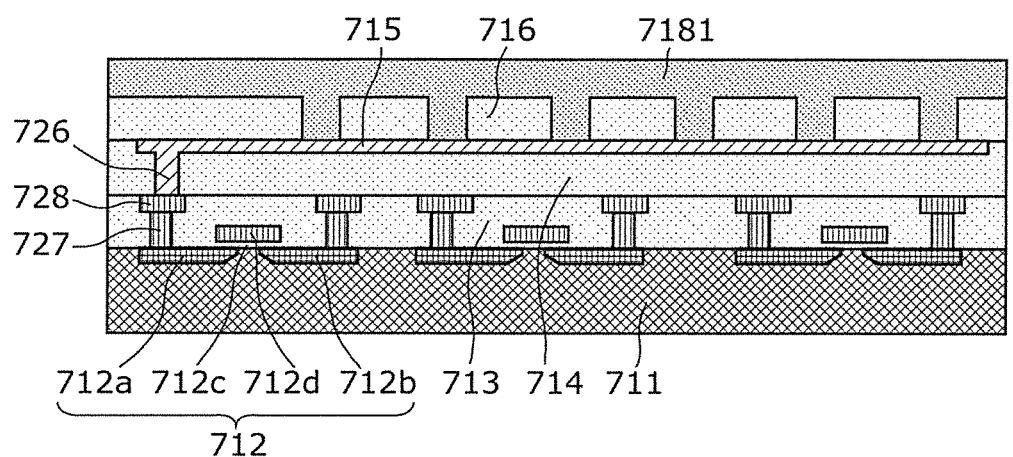
[FIG. 12C] is a diagram showing, in the method of manufacturing the nonvolatile semiconductor memory device according to Embodiment 5, a process of forming a lower electrode layer embedded in a contact hole.
Figure 12D:
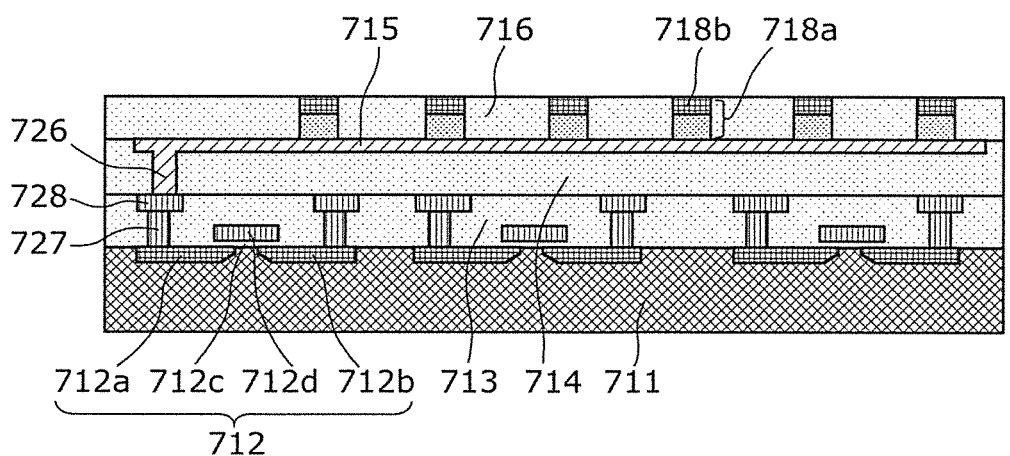
[FIG. 12D] is a diagram showing, in the method of manufacturing the nonvolatile semiconductor memory device according to Embodiment 5, a process of removing the lower electrode layer on the interlayer insulating layer by CMP.

FIG. 12C is a diagram showing a process of forming a lower electrode material layer 7181 which is a layer for forming the lower electrode layer 718 that is embedded in the contact hole 731. FIG. 12D is a diagram showing a process of removing the lower electrode material layer 7181 on the interlayer insulating layer 716 with a CMP process. At this time, the surface of the lower electrode layer 718 is oxidized with the CMP process, and the oxidatively degraded layer 718b is naturally formed. As a result, the lower electrode layer 718 has a structure in which the oxidatively degraded layer 718b on the surface and the first conductive layer 718a which is in the contact hole and is not degraded are stacked.

Figure 12E:
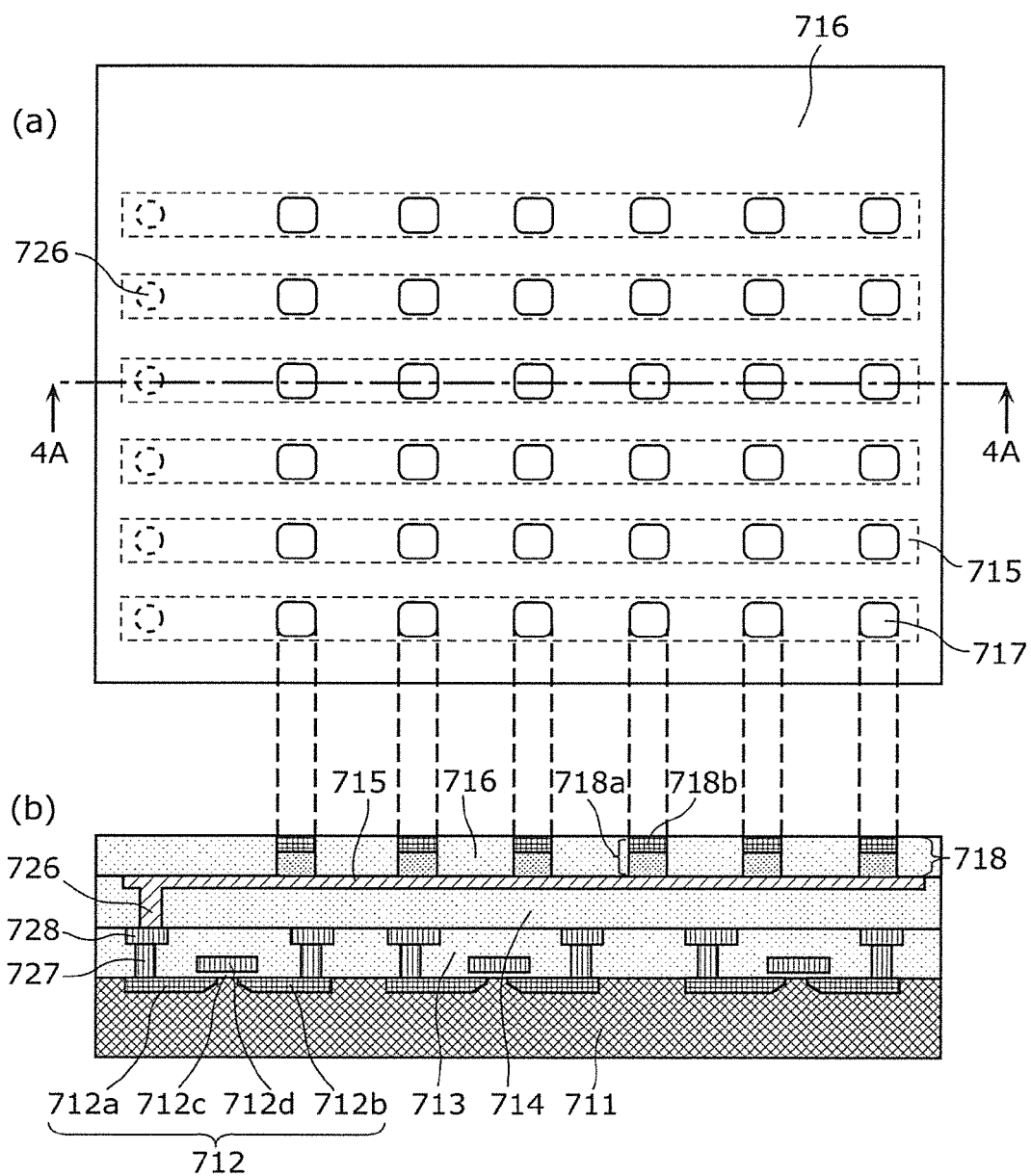
[FIG. 12E] (a) in FIG. 12E is a plan view showing, in the method of manufacturing the nonvolatile semiconductor memory device according to Embodiment 5, a state in which a lower electrode layer is embedded in the contact hole. (b) in FIG. 12E is a cross-sectional view as viewed from the direction of the arrow along the line 4A-4A in (a) in FIG. 12E.

(a) in FIG. 12E is a plan view of a state in which the first conductive layer 718a and the oxidatively degraded layer 718b are embedded in the contact hole 731. (b) in FIG. 12E is a cross-sectional view as viewed from the direction of the arrow along the line 4A-4A in (a) in FIG. 12E.

Figure 12F:
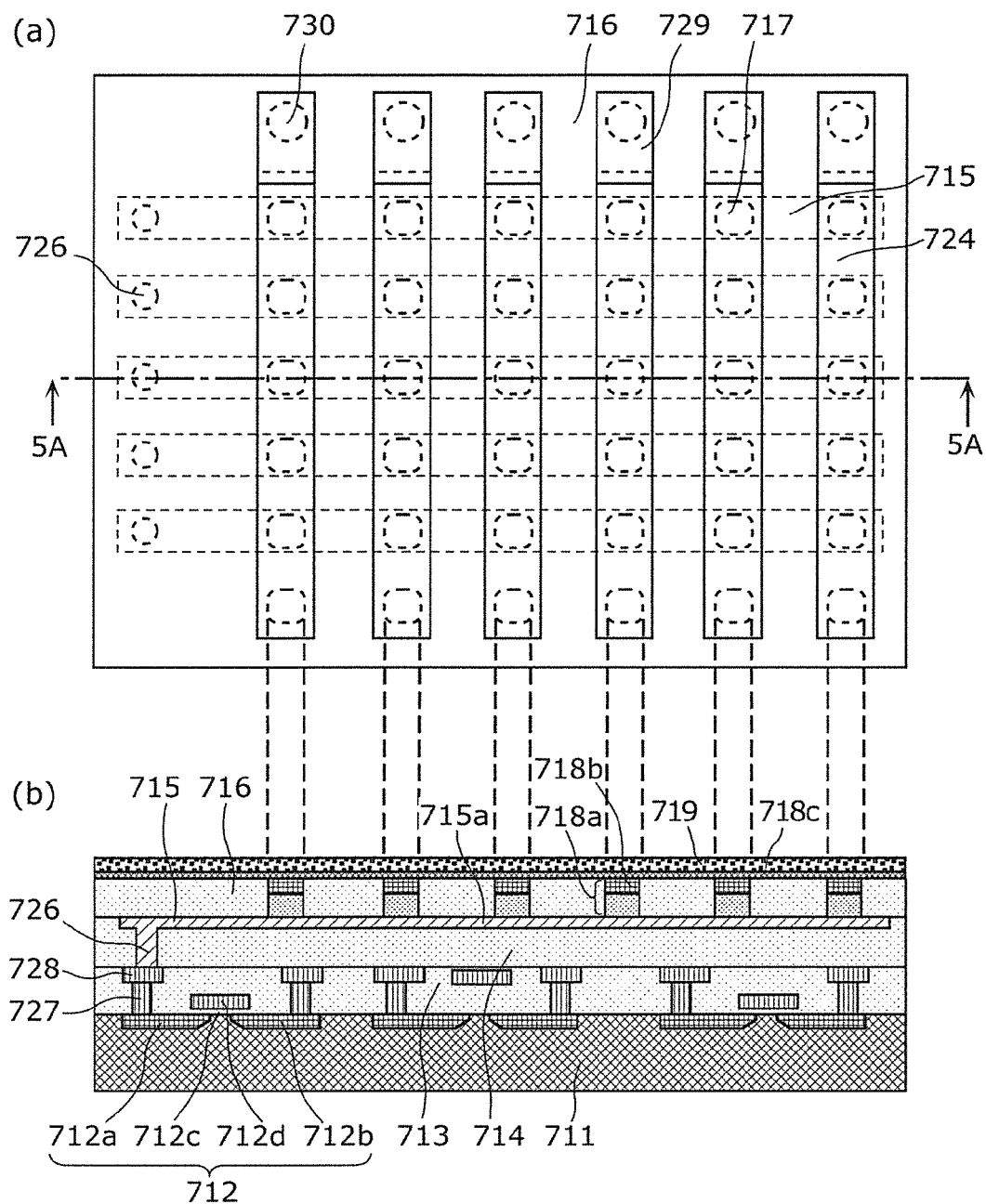
[FIG. 12F] (a) in FIG. 12F is a plan view showing, in the method of manufacturing the nonvolatile semiconductor memory device according to Embodiment 5, a state in which a second conductive layer and a variable resistance layer are continuously formed. (b) in FIG. 12F is a cross-sectional view as viewed from the direction of the arrow along the line 5A-5A in (a) in FIG. 12F.

Furthermore, (a) in FIG. 12F is a plan view of a state in which the second conductive layer 718c and the variable resistance layer 719 are formed. (b) in FIG. 12F is a cross-sectional view as viewed from the direction of the arrow along the line 5A-5A in (a) in FIG. 12F.

Figure 12G:
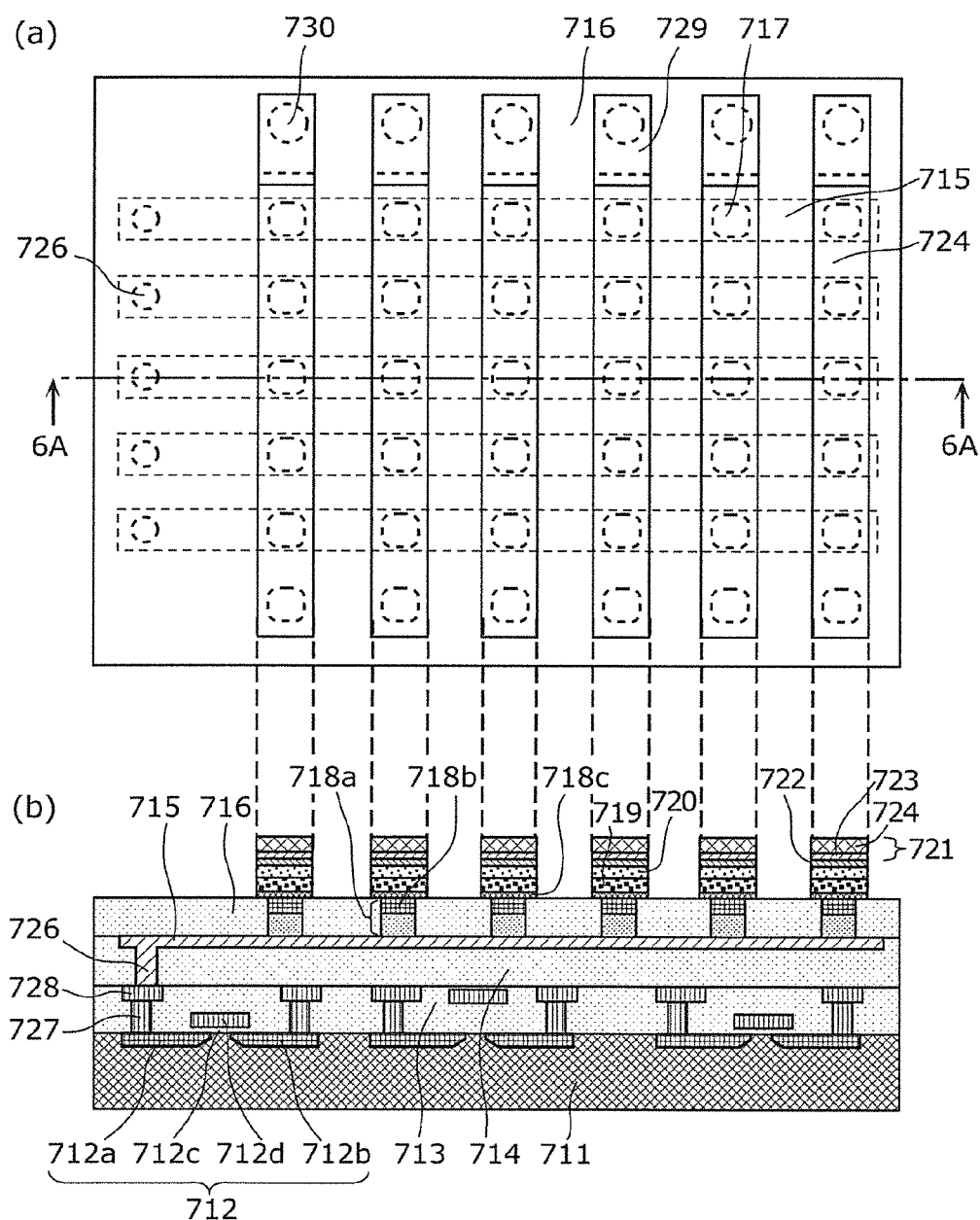
[FIG. 12G] (a) in FIG. 12G is a plan view showing, in the method of manufacturing the nonvolatile semiconductor memory device according to Embodiment 5, a state in which an upper electrode layer and a non-ohmic element are formed and processed into a desired shape. (b) in FIG. 12G is a cross-sectional view as viewed from the direction of the arrow along the line 6A-6A in (a) in FIG. 12G.

(a) in FIG. 12G is a plan view of a state in which the upper electrode layer 720 and the non-ohmic element 721 are formed and processed into a desired shape. (b) in FIG. 12G is a cross-sectional view as viewed from the direction of the arrow along the line 6A-6A in (a) in FIG. 12G.

First, as shown in FIG. 12A, the lower electrode line 715 and the interlayer insulating layer 716 are formed above the substrate 711 on which a plurality of the active elements 712, the electrode line 728, interlayer insulating layers 713, and 714 are formed. The electrode line 728 conventionally most often comprises aluminum. However, lately, the electrode line 728 most often comprises copper that can realize a low resistance even when miniaturized. Furthermore, in order to reduce the parasitic capacitance between the lines, the interlayer insulating layers 713 and 714 comprise a fluorine-containing oxide (e.g., SiOF), a carbon-containing nitride (e.g., SiCN), or an organic resin material (e.g., polyimide). In this embodiment as well, for example, copper can be used as the electrode line 728, and, for example, SiOF that is a fluorine-containing oxide can be used as the interlayer insulating layers 713 and 714.

Note that, the lower electrode lines 715 are embedded in the interlayer insulating layer 714, which can be formed as follows. Specifically, in the interlayer insulating layer 714, grooves in a stripe pattern for embedding the lower electrode lines 715, and a contact hole for connecting the lower electrode lines 715 to the electrode line 728 are formed. These can be easily formed using a technique used in a general semiconductor manufacturing process. After forming such a groove and a contact hole, a conductive film that will be formed into the lower electrode lines 715 is formed, and then, for example, a CMP is performed. The lower electrode line 715 having a shape shown in FIG. 12A can be thus formed. Note that, the lower electrode line 715 is not limited to the above-described Ti—Al—N alloy material but may comprise, for example, Cu, Al, Ti—Al alloy, or a stacked structure thereof.

Next, as shown in FIG. 12A, the interlayer insulating layer 716 comprising TEOS-SiO is formed above the substrate 711 which includes the lower electrode lines 715, using a CVD method for example. Note that, a variety of materials can be used as the interlayer insulating layer 716 as mentioned earlier.

After this, as shown in FIG. 12B the contact holes 731 are formed in an array with constant pitch in the interlayer insulating layer 716 which is on the lower electrode lines 715. Each of the contact holes 731 has a shape smaller than a width of the lower electrode line 715, as indicated in (a) in FIG. 12B. Note that, although (a) in FIG. 12B shows a rectangular shape, a circular shape, an oval shape, or any other shape is acceptable. Such a contact hole 731 can be formed by an ordinary semiconductor manufacturing process, and thus a detailed description thereof is omitted.

Next, as shown in FIG. 12C, on the interlayer insulating layer 716 including the contact holes 731, the lower electrode material layer 7181 for forming the lower electrode layer 718 is formed. A tantalum nitride is formed in this embodiment. Such a tantalum nitride film may be produced in a nitrogen gas atmosphere using a Ta target, for example, at a room temperature condition, with the pressure of a chamber in the range of 0.03 Pa to 3 Pa, and the Ar/$N_2$ flow rate in the range of 20 sccm/5 sccm to 20 sccm/30 sccm. Note that, the deposition method is not limited to the sputtering, but the CVD method, the ALD method, or the like may be used.

Next, as shown in FIG. 12D, only the lower electrode material layer 7181 which covers the surface of the interlayer insulating layer 716 is removed through the CMP process, thereby forming the lower electrode layer 718 embedded in the contact hole 731. At this time, the surface of the lower electrode layer 718 is oxidized with the CMP process, and the oxidatively degraded layer 718b is naturally formed. As a result, at this moment, the lower electrode layer 718 has a structure in which the oxidatively degraded layer 718b on the surface and the first conductive layer 718a which is in the contact hole and is not degraded are stacked. (a) and (b) in FIG. 12E respectively shows a plan view and a cross-sectional view of the state shown in FIG. 12D.

Subsequently, as shown in FIG. 12F, the second conductive layer 718c and the variable resistance layer 719 are continuously deposited in a same deposition apparatus so that the second conductive layer 718c is connected to the oxidatively degraded layer 718b. With this, the second conductive layer 718c and the variable resistance layer 719 are continuously formed without exposure to the atmosphere. This makes it possible to prevent the formation of the oxidatively degraded layer at the interface between the layers. With this, the oxidatively degraded layer 718b does not become a parasitic resistance component of the variable resistance element 717. As a result, a current value of the variable resistance element 717 in the low resistance state increases, and its window of operation is enlarged. With this, the nonvolatile semiconductor memory device operates stably and has an improved endurance characteristic that is durability against repeated writing.

As the variable resistance layer 719, a $TaO_x$ film is deposited on the second conductive layer 718c and the interlayer insulating layer 716 using a reactive sputtering method. Such a $TaO_x$ film may be produced in an oxygen gas atmosphere using a Ta target, for example, at a room temperature condition, with the pressure of a chamber in the range of 0.03 Pa to 3 Pa, and the $Ar/O_2$ flow rate in the range of 20 sccm/5 sccm to 20 sccm/30 sccm. Note that, the deposition method is not limited to the sputtering, but the CVD method, the ALD method, or the like may be used.

Next, as shown in (b) in FIG. 12G, on the variable resistance layer 719, the upper electrode layer 720, the first electrode layer 722 included in the non-ohmic element 721, the insulating layer 723, and the second electrode layer 724 are formed, and then are processed into a desired shape through a dry etching process. As the upper electrode layer 720, an iridium electrode film having a thickness of 50 nm is formed using a DC sputtering method. Furthermore, as the first electrode layer 722 and the second electrode layer 724, aluminum is formed using a sputtering method. As the insulating layer 723, a silicon nitride is formed using a reactive sputtering method. Forming SiN using a sputtering method makes it easy to form a thin film that is highly insulating and dense.

Each of the upper layer electrode lines 729 is formed so as to connect to the second electrode layer 724 outside the region in which the variable resistance elements 717 and the MIM diodes each of which is the non-ohmic element 721 are formed in a matrix. The upper layer electrode line 729 may comprise a material similar to the material comprised in the lower electrode line 715. Then, when the upper layer electrode lines 729 are formed, the embedded conductors 730 are also formed at the same time. The upper layer electrode lines 729 are connected to a semiconductor electrode line (not shown) in a lower layer through the embedded conductors 730 so as to be electrically connected to an active element provided at a position not shown in the drawing.

After this, an insulating protection film (not shown) that covers the second electrode layer 724 and the upper layer electrode lines 729 is formed. The nonvolatile semiconductor memory device 710 shown in FIG. 9 can be thus manufactured.

Note that, although this embodiment described the case of using an MIM diode which includes SiN as the insulating layer 723, the present invention is not limited to this. For example, a tantalum oxide (TaO), alumina (AlO), or titania (TiO) may be used as the insulating layer 723. When TaO is used, any methods may be used, such as forming a Ta film and then form a TaO film using a dry thermal oxidation method, a we thermal oxidation method, or a plasma oxidation method, or directly forming a TaO film using a reactive sputtering method.

Although the nonvolatile semiconductor memory device and its manufacturing method according to the present invention have thus far been described based on Embodiments 1 to 5, the present invention is not limited to such embodiments. For example, embodiments resulting from various modifications of the exemplary embodiments as well as embodiments resulting from combinations of arbitrary structural elements of the different exemplary embodiments that may be conceived by those skilled in the art are intended to be included within the scope of the present invention.

For example, in any of Embodiments 1 to 5, a transition metal or aluminum (Al) can be used as the metal of the metal oxide comprised in the variable resistance layer. The transition metal is not limited to only tantalum but may be titanium (Ti), hafnium (Hf), zirconium (Zr), niobium (Nb), tungsten (W), nickel (Ni), or the like.

Furthermore, although the variable resistance layer 719 in Embodiment 5 is a single layer, the variable resistance layer 719 may have two variable resistance layers having a different degree of oxygen deficiency.

Furthermore, the method of manufacturing the nonvolatile semiconductor memory device according to the present invention may further include, between forming the first conductive layer and forming the second conductive layer, removing the oxidatively degraded layer formed on the upper surface of the first conductive layer.

For example, a titanium nitride thin-film is formed as the first conductive layer 202a using a CVD method, in a similar manner as in Embodiment 2. Titanium chloride is used as a source, and ammonia is used as reactive gas. The first conductive layer 202a formed through the CVD process is taken out of the deposition apparatus once and is exposed to the atmosphere in order to form the variable resistance layer 103 later through a sputtering process. As a result, the first conductive layer 202a is naturally oxidized, and thus the oxidatively degraded layer 202b is formed. Then, the oxidatively degraded layer 202b is removed using a "reverse sputtering method", that is, plasma is formed on the substrate-side by introducing Ar gas and sputtering the surface of the substrate to clean the surface of the substrate. After this, the second conductive layer 102c and the variable resistance layer 103 are continuously formed on the first conductive layer 102a in the same deposition apparatus (through a sputtering process) without exposure to the atmosphere, as with Embodiment 3.

With this manufacturing method as well, the second conductive layer included in the lower electrode layer, and the variable resistance layer are continuously formed without being exposed to the atmosphere. With this, the parasitic resistance between the lower electrode included in the variable resistance element and the variable resistance layer is reduced. Thus, a nonvolatile semiconductor memory device including a variable resistance element which has small variation in characteristics, is capable of stable operation, has superior resistance against deterioration of endurance, has a large capacity, and is suitable for high integration is realized.

INDUSTRIAL APPLICABILITY

The present invention is useful as a nonvolatile semiconductor memory device, and is particularly useful as a nonvolatile semiconductor memory device which realizes a stable operation and has improved characteristics on repeated writing (endurance). For example, the present invention is useful as a nonvolatile semiconductor memory device used in various electronic devices.

REFERENCE SIGNS LIST 100a, 100b, 200a, 200b, 300a, 300b, 400a, 400b Nonvolatile semiconductor memory device
101, 201, 301, 401 Substrate
102, 202, 302, 402 Lower electrode layer
102a, 202a, 302a, 402a First conductive layer
102c, 202c, 302c, 402c Second conductive layer
103, 203, 303, 403 Variable resistance layer
103a, 203a, 303a, 403a First variable resistance layer
103b, 203b, 303b, 403b Second variable resistance layer
104, 204, 304, 404 Upper electrode layer
108, 208, 308, 408 Variable resistance element
202b, 402b Oxidatively degraded layer
305, 405 First electrode layer
306, 406 Semiconductor layer
307, 407 Second electrode layer
309, 409 Non-ohmic element
705 Word line decoder
706 Bit line decoder
707 Read circuit
710 Nonvolatile semiconductor memory device (ReRAM)
711 Substrate
712 Active element
712a Source region
712b Drain region
712c Gate insulating film
712d Gate electrode
713, 714, 716 Interlayer insulating layer
715 Lower electrode line
717 Variable resistance element
718 Lower electrode layer
718a First conductive layer
718b Oxidatively degraded layer
718c Second conductive layer
719 Variable resistance layer
720 Upper electrode layer
721 Non-ohmic element
722 First electrode layer
723 Insulating layer
724 Second electrode layer
726, 727, 730 Embedded conductor
728 Electrode line
729 Upper layer electrode line
731 Contact hole
7181 Lower electrode material layer

The invention claimed is:

1. A variable resistance nonvolatile semiconductor memory device comprising:
a substrate; and
a variable resistance element formed on the substrate, having a resistance value which changes in response to application of an electric pulse, and holding the changed resistance value,
wherein the variable resistance element includes (i) a lower electrode layer formed on the substrate, (ii) a variable resistance layer formed on the lower electrode layer and comprising a metal oxide, and (iii) an upper electrode layer formed on the variable resistance layer,
the lower electrode layer includes at least a first conductive layer and a second conductive layer which is formed on the first conductive layer and is in contact with the variable resistance layer, and
the first conductive layer includes an oxidatively degraded layer which is formed on an upper surface of the first conductive layer due to oxidization of the first conductive layer.

2. The nonvolatile semiconductor memory device according to claim 1,
wherein an oxygen content in vicinity of an interface between the variable resistance layer and the second conductive layer is smaller than an oxygen content in vicinity of an interface between the second conductive layer and the first conductive layer.

3. The nonvolatile semiconductor memory device according to claim 1,
wherein the second conductive layer and the variable resistance layer are continuously formed without being exposed to an atmosphere.

4. The nonvolatile semiconductor memory device according to claim 1, further comprising
a non-ohmic element formed on the upper electrode layer,
wherein the non-ohmic element includes (i) a first electrode layer formed on the upper electrode layer, (ii) a semiconductor layer or an insulating layer formed on the first electrode layer, and (iii) a second electrode layer formed on the semiconductor layer or the insulating layer.

5. The nonvolatile semiconductor memory device according claim 1,
wherein the variable resistance layer is an oxygen-deficient metal oxide.

6. The nonvolatile semiconductor memory device according to claim 5,
wherein the variable resistance layer includes a first variable resistance layer and a second variable resistance layer which are metal oxides having a different degree of oxygen deficiency.

7. A method of manufacturing a variable resistance nonvolatile semiconductor memory device, the method comprising
forming, on a substrate, a variable resistance element having a resistance value which changes in response to application of an electric pulse, and holding the changed resistance value,
wherein the forming includes:
forming a lower electrode layer on the substrate;
forming, on the lower electrode layer, a variable resistance layer comprising a metal oxide; and
forming an upper electrode layer on the variable resistance layer,
the lower electrode layer includes at least a first conductive layer and a second conductive layer which is formed on the first conductive layer and is in contact with the variable resistance layer,
the first conductive layer includes an oxidatively degraded layer which is formed on an upper surface of the first conductive layer due to oxidization of the first conductive layer, and
the second conductive layer and the variable resistance layer are continuously formed without being exposed to an atmosphere.

8. The method according to claim 7,
wherein the forming of a lower electrode layer includes:
forming, on the substrate, a lower electrode material layer which is for forming the first conductive layer;
forming the first conductive layer which includes, on its upper surface, the oxidatively degraded layer by performing chemical mechanical polishing on the lower electrode material layer; and forming the second conductive layer on the first conductive layer.

9. The method according to claim 8, further comprising:

forming lower electrode lines in a stripe pattern on the substrate;

forming an interlayer insulating layer on the substrate including surfaces of the lower electrode lines;

forming, in the interlayer insulating layer, contact holes at positions facing the lower electrode lines;

forming, on the upper electrode layer, a first electrode layer which is to be a part of a non-ohmic element;

forming, on the first electrode layer, a semiconductor layer or an insulating layer which is to be a part of the non-ohmic element; and forming, on the semiconductor layer or the insulating layer, second electrode layers each of which is to be a part of the non-ohmic element, the second electrode layers being in a stripe pattern and three-dimensionally crossing the lower electrode lines, wherein in the forming of a lower electrode material layer, the lower electrode material layer is formed on the contact holes and the interlayer insulating layer, and in the performing of chemical mechanical polishing, the lower electrode material layer on the interlayer insulating layer is removed.

10. The method according to claim 7, wherein the forming of a variable resistance element further includes removing the oxidatively degraded layer between forming the first conductive layer and forming the second conductive layer.

* * * * *